United States Patent
Gründer et al.

(10) Patent No.: US 9,896,779 B2
(45) Date of Patent: Feb. 20, 2018

(54) METHOD FOR PRODUCING III-N SINGLE CRYSTALS, AND III-N SINGLE CRYSTAL

(71) Applicant: FREIBERGER COMPOUND MATERIALS GMBH, Freiburg (DE)

(72) Inventors: Marit Gründer, Berlin (DE); Frank Brunner, Berlin (DE); Eberhard Richter, Berlin (DE); Frank Habel, Freiberg (DE); Markus Weyers, Wildau (DE)

(73) Assignee: FREIBERGER COMPOUND MATERIALS GMBH, Freiberg (DE)

( * ) Notice: Subject to any disclaimer, the term of this patent is extended or adjusted under 35 U.S.C. 154(b) by 0 days.

(21) Appl. No.: 14/386,833

(22) PCT Filed: Mar. 21, 2013

(86) PCT No.: PCT/EP2013/055891
§ 371 (c)(1),
(2) Date: Sep. 22, 2014

(87) PCT Pub. No.: WO2013/139887
PCT Pub. Date: Sep. 26, 2013

(65) Prior Publication Data
US 2015/0292111 A1    Oct. 15, 2015

Related U.S. Application Data

(60) Provisional application No. 61/614,161, filed on Mar. 22, 2012, provisional application No. 61/614,190, filed on Mar. 22, 2012.

(30) Foreign Application Priority Data

Mar. 21, 2012  (DE) .................. 10 2012 204 551
Mar. 21, 2012  (DE) .................. 10 2012 204 553

(51) Int. Cl.
H01L 29/20 (2006.01)
C30B 25/16 (2006.01)
(Continued)

(52) U.S. Cl.
CPC .............. C30B 25/16 (2013.01); C30B 25/04 (2013.01); C30B 25/10 (2013.01); C30B 25/18 (2013.01);
(Continued)

(58) Field of Classification Search
CPC ............ H01L 29/2003; H01L 21/0254; C30B 29/403; C30B 29/406
See application file for complete search history.

(56) References Cited

U.S. PATENT DOCUMENTS 6,440,823 B1    8/2002    Vaudo et al.
2002/0068201 A1  6/2002    Vaudo et al.
(Continued)

FOREIGN PATENT DOCUMENTS

CN    101258271    9/2008
CN    102268737    12/2011
(Continued)

OTHER PUBLICATIONS

Headrick et al., Ion-assisted nucleation and growth of GaN on sapphire (0001), Phys. Rev. B, vol. 58, 1998, pp. 4818-4824.*
(Continued)

Primary Examiner — Syed Gheyas
(74) Attorney, Agent, or Firm — A.C. Entis-IP Ltd.

(57) ABSTRACT

The present invention relates to the production of III-N templates and also the production of III-N single crystals, III signifying at least one element of the third main group of the periodic table, selected from the group of Al, Ga and In. By adjusting specific parameters during crystal growth, III-N templates can be obtained that bestow properties on the
(Continued)

crystal layer that has grown on the foreign substrate which enable flawless III-N single crystals to be obtained in the form of templates or even with large III-N layer thickness.

20 Claims, 8 Drawing Sheets

(51) Int. Cl.
    *C30B 29/40* (2006.01)
    *H01L 21/02* (2006.01)
    *C30B 25/10* (2006.01)
    *C30B 25/04* (2006.01)
    *C30B 25/18* (2006.01)

(52) U.S. Cl.
    CPC ............ *C30B 29/40* (2013.01); *C30B 29/403* (2013.01); *C30B 29/406* (2013.01); *H01L 21/0242* (2013.01); *H01L 21/0254* (2013.01); *H01L 21/0262* (2013.01); *H01L 21/02436* (2013.01); *H01L 21/02458* (2013.01); *H01L 21/02488* (2013.01); *H01L 29/2003* (2013.01); *Y10T 428/24851* (2015.01)

(56) References Cited

U.S. PATENT DOCUMENTS

| | | | |
|---|---|---|---|
| 2002/0096106 A1* | 7/2002 | Kub | H01L 21/2007 117/94 |
| 2003/0232457 A1* | 12/2003 | Kawaguchi | C30B 25/02 438/46 |
| 2005/0064206 A1 | 3/2005 | Akita et al. | |
| 2006/0046325 A1 | 3/2006 | Usui et al. | |
| 2007/0072320 A1 | 3/2007 | Frayssinet et al. | |
| 2007/0141814 A1* | 6/2007 | Leibiger | C30B 23/02 438/483 |
| 2007/0197004 A1 | 8/2007 | Dadgar et al. | |
| 2008/0217645 A1 | 9/2008 | Saxler et al. | |
| 2009/0085165 A1 | 4/2009 | Hiramatsu et al. | |
| 2009/0092815 A1 | 4/2009 | Dmitriev et al. | |
| 2009/0250719 A1* | 10/2009 | Fujimori | B82Y 20/00 257/103 |
| 2010/0096727 A1 | 4/2010 | Hennig et al. | |
| 2013/0256697 A1 | 10/2013 | Dadgar et al. | |
| 2013/0270575 A1 | 10/2013 | Humphreys et al. | |

FOREIGN PATENT DOCUMENTS

| | | |
|---|---|---|
| DE | 102005041643 | 8/2005 |
| DE | 102006008929 | 2/2006 |
| DE | 102005023302 | 11/2006 |
| DE | 102010056409 | 12/2010 |
| EP | 1501117 | 1/2005 |
| EP | 2136390 | 12/2009 |
| EP | 2299236 | 3/2011 |
| JP | H11191657 | 7/1999 |
| JP | 11354846 | 12/1999 |
| WO | 2006035212 | 4/2006 |
| WO | 2007068756 | 6/2007 |
| WO | 2007107757 | 9/2007 |
| WO | 2008087452 | 7/2008 |
| WO | 2008096168 | 8/2008 |
| WO | 2012035135 | 3/2012 |

OTHER PUBLICATIONS

Napierala et al; Stress control in GaN/sapphire templates for the fabrication of crack-free thick layers; Journal of Crystal Growth, 289 (2), 2006.
Richter et al; Hydride vapor phase epitaxy of GaN boules using high growth rates; Journal of Crystal Growth, 312 (18), 2010.
Brunner et al; Growth optimization during III-nitride multiwafer MOVPE using real-time curvature, reflectance and true temperature measurements; Journal of Crystal Growth, 298, 2007.
Richter et al; GaN boules grown by high HVPE; Physica Status Solidi; 2011.
Darakchieva et al; Lattice parameters of bulk GaN fabricated by halide vapor phase epitaxy; Journal of Crystal Growth, 310 (5), 2008.
Moram et al; X-Ray diffraction of III-Nitrides; Reports on Progress in Physics; vol. 72; No. 3, 2009.
Hearne et al; Stress evolution during metalorganic chemical vapor deposition of GaN; Applied Physics Letters; vol. 74, No. 3; Jan. 18, 1999.
Ahmad et al; Dependence of the stress-temperature coefficient on dislocation density in epitaxial GaN grown on and 6H-SiC substrates; Journal of Applied Physics, 95 (4), 2004.
Shen et al; Calculated strain energy of hexagonal epitaxial thin films; Journal of Crystal Growth, vol. 240 (1-2), 2002.
Brunner et al, Quantitative analysis of in situ wafer bowing measurements for III-Nitride growth on sapphire; Journal of Crystal Growth, 310 (10), 2008.
Hertkorn et al; Process optimization for the effective reduction of threading dislocations in MOVPE grown GaN using in situ deposited SiNx masks; Journal of Crystal Growth, 310, 2008.
Tanaka et al; Anti-surfactant in III-Nitride epitaxy quantum dot formation and dislocation termination; The Japan Society of Applied Physics; 38 (8B); Aug. 15, 2000.
Krost et al; In situ monitoring of the stress evolution in growing group-III-Nitride layers; 275, 2005.
International Preliminary Report on Patentability dated Oct. 2, 2014 for corresponding PCT Application PCT/EP2013/055891, international filing date Mar. 21, 2013.
International Preliminary Report on Patentability dated Oct. 2, 2014 for corresponding PCT Application PCT/EP2013/055892, international filing date Mar. 21, 2013.
Chinese Office Action dated Apr. 25, 2016 for corresponding application No. 201380015539.8.
Japanese Office Action dated Dec. 6, 2016 for corresponding application No. 2015-500920.
European Office Action dated Jan. 4, 2017 for corresponding application No. 13712740.3.
European Office Action dated Jan. 10, 2017 for corresponding application No. 13712741.1.
O. Klein et al., TTEM investigations on growth interrupted samples for the correlation of the dislocation propagation and growth mode variations in AIGaN deposited on SiNx interlayershe dislocation propagation, Journal of Crystal Growth, vol. 324, No. 1, Jun. 1, 2011 (Jun. 1, 2011), pp. 63-72, XP055013447, ISSN: 0022-0248.
C. R. Miskys et al., GaN homoepitaxy by metalorganic chemical-vapor deposition on free-standing GaN substrates, Applied Physics Letters, A I P Publishing LLC, US, vol. 77, No. 12, Sep. 18, 2000 (Sep. 18, 2000), pp. 1858-1860.
A. Krost et al., Strain evaluation in AlInN/GaN Bragg mirrors by in situ curvature measurements and ex situ x-ray grazing incidence and transmission scattering, Applied Physics Letters, A I P Publishing LLC, US, vol. 97, No. 18, Nov. 3, 2010 (Nov. 3, 2010), pp. 181105-181105, XP012137485, ISSN: 0003-6951.
G. Martinez-Criado et al., Free-standing GaN grown on epitaxial lateral overgrown GaN substrates, Journal of Crystal Growth, Elsevier, Amsterdam, NL, vol. 255, No. 3-4, Aug. 1, 2003 (Aug. 1, 2003), pp. 277-281, XP004434559, ISSN: 0022-0248, DOI: 10.1016/S0022-0248(03)01293-4.
Japanese Office Action dated Jul. 4, 2017 for corresponding JP application No. 2015-500921.
US Office Action dated Jul. 13, 2017 for corresponding U.S. Appl. No. 14/386,845.

* cited by examiner

Figure 1

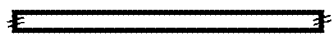

(i) Cross-section of the substrate at room temperature

(ii) Cross-section of the substrate at desorption temperature

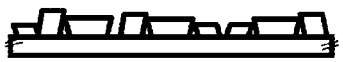

(iii) Cross-section of the substrate with a III-N nucleation layer at nucleation temperature

(iv) Cross-section of the substrate after re-crystallisation and growth up to the beginning of coalescence of the III-N layer at re-crystallisation temperature

(v) Cross-section of the substrate with III-N layer located thereon at second growth temperature and complete coalescence

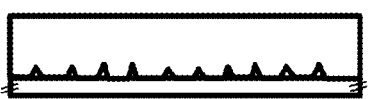

(vi) Cross-section of the substrate with a compressively stressed deposited III-N layer and with low curvature Fig. 6 A  Fig. 6 B
(1)  
(2) 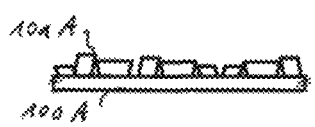 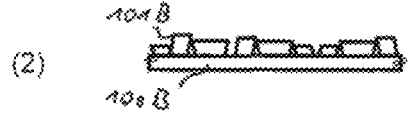
(3) 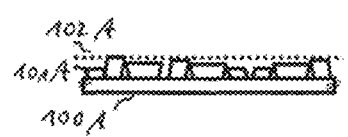 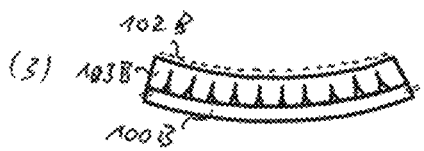
(4)  
(5)  
(6)  

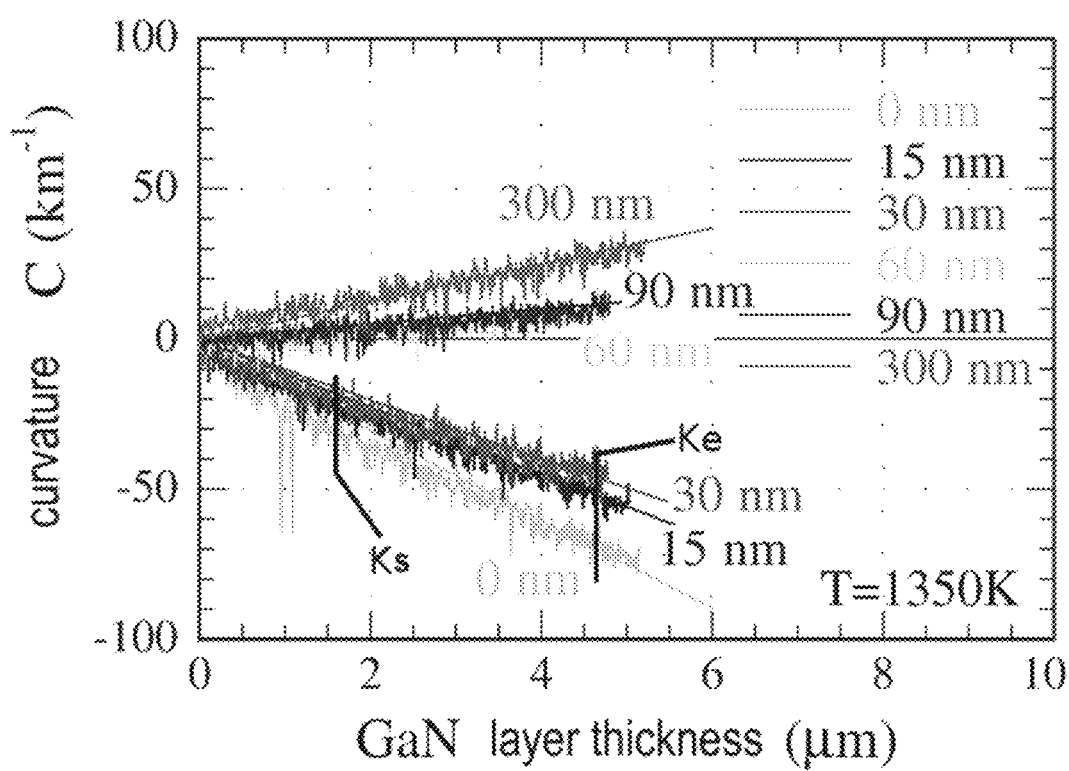

METHOD FOR PRODUCING III-N SINGLE CRYSTALS, AND III-N SINGLE CRYSTAL

RELATED APPLICATIONS

The present application is a U.S. National Phase of PCT Application PCT/EP2013/055891, filed on Mar. 21, 2013, which claims the benefit under 35 U.S.C. § 119(a)-(d) of German patent application No. 10 2012 204 553.8 filed Mar. 21, 2012, and German patent application No. 10 2012 204 551.1 filed Mar. 21, 2012, and which claims the benefit under 35 U.S.C. § 119(e) of U.S. provisional application No. 61/614,161 filed Mar. 22, 2012, and U.S. provisional application 61/614,190 filed Mar. 22, 2012. The contents and disclosures of these prior applications are incorporated herein by reference in their entirety.

FIELD OF THE INVENTION

The present invention relates to processes for producing composite substrates (called "template(s)" in the following) and for producing III-N single crystals. The processes according to the present invention allow to produce crack-free III-N single crystals which are in particular suitable for use as wafers. III denotes at least one element of the main group III of the periodic table of the elements, selected from the group of Al, Ga and In.

BACKGROUND

III-N single crystals are of great technical importance. A multitude of semiconductor devices and optoelectronic devices such as power components, high-frequency components, light-emitting diodes and lasers are based on these materials. Epitaxial crystal growth on a starting substrate is frequently carried out when producing such devices, or a template is initially formed on a starting substrate, onto which III-N layers or respectively III-N boules can be subsequently grown by further epitaxial growth. III-N substrates or in particular foreign substrates can be used as starting substrates. When using foreign substrates, stresses and cracks within a III-N layer can occur during the growth due to the differences between the thermal expansion coefficients of starting substrate and epitaxial layer. Thicker layers of up to 1 mm can also be grown with the aid of partially structured interlayers composed of WSiN, TiN or $SiO_2$, wherein said thicker layers can be subsequently separated as free-standing layers which typically have plastic, concavely bent c lattice planes and surfaces. In particular in case it is dispensed with an intermediate layer in such a process, at or above the interface between starting substrate and epitaxial III-N layer vertical and horizontal,microcracks form, which can expand over time and which can lead to breaking of the GaN layer during or after the cooling process.

From investigations by Hearne et al., Applied Physics Letters 74, 356-358 (1999) it is known that during the deposition of GaN on a sapphire substrate an intrinsic tensile stress builds up which increases with the growth. An in situ stress monitoring showed that the tensile stress produced by the growth cannot be measurably relaxed by annealing or thermal cycling. This means inter alia that a stress obtained at the end of the growth of the GaN layer will have the same value again after cooling and reheating to the same (growth) temperature. In Hearne et al. also an explanation of the background, relationships and possibilities for observation of extrinsic (namely generated by different thermal expansion coefficients between sapphire substrate and GaN layer) and intrinsic (namely generated by growth) stress is given.

In this regard Napierala et al. in Journal of Crystal Growth 289, 445-449 (2006) describe a process for producing GaN/sapphire templates onto which crack-free thin GaN layers are grown by being able to control the intrinsic stress in the gallium nitride through the setting of the density of gallium nitride crystallites in such a way that stresses in the thin layers can be released by bending. In this process, however, thick layers cannot compensate the pressure during the growth and tend to breaking despite the bending. Richter et al. (E. Richter, U. Zeimer, S. Hagedorn, M. Wagner, F. Brunner, M. Weyers, G. Tränkle, Journal of Crystal Growth 312, [2010] 2537) describe a process for producing GaN crystals via Hydride Vapor Phase Epitaxy (HVPE) in which GaN layers having a thickness of 2.6 mm can be grown in a crack-free manner by setting the partial pressure of gallium chloride, wherein the obtained GaN layers exhibit a multitude of V-pits on the surface. A crystal grown with this process has a thickness of 5.8 mm, it however exhibits longer cracks. Brunner et al. in Journal of Crystal Growth 298, 202-206 (2007) show the influence of the layer thickness on the curvature of the epitaxial III-N layer. The growth of GaN and AlGaN, optionally with InGaN compliance layer, on GaN-sapphire template is investigated. It was found that for GaN and AlGaN with 2.8% and 7.6% of Al mole fraction the concave curvature increases during the growth, which according to observation accompanies the generation of a tensile stress (cf. FIG. 3). Furthermore, the concave curvature increases with rising aluminium content, accordingly the tensile stress further increases. In addition, the influence of a Si-doped indiumgallium nitride layer on the growth of an AlGaN layer with 7.6% of Al mole fraction on a GaN buffer layer is shown. For this purpose on the one hand an AlGaN layer with 7.6% of Al mole fraction is directly grown onto a GaN buffer layer, and on the other hand a Si-doped indium gallium nitride layer as interlayer is grown onto a GaN buffer layer, wherein subsequently an AlGaN layer with 7.6% of Al mole fraction is grown onto the interlayer. It was thus shown that the deposition of a Si-doped indium gallium nitride layer onto a GaN buffer layer leads to compressive stress in the crystal. During this process the initially concave curvature of the GaN buffer layer is transformed into a slightly convex curvature in the course of a temperature reduction, and this convex curvature increases during the further growth by epitaxially growing an $In_{0.06}GaN$ layer within the same process. During the subsequent deposition of an $Al_{0.076}GaN$ layer onto this $In_{0.06}GaN$ layer a concave curvature is eventually obtained, which is comparatively lower than the resulting curvature without $In_{0.06}GaN$ interlayer.

E. Richter, M. Grtinder, B. Schineller, F. Brunner, U. Zeimer, C. Netzel, M. Weyers and G. Tränkle (Phys. Status Solidi C 8, No. 5 (2011) 1450) describe a process for producing GaN crystals via HVPE, wherein a thickness of up to 6.3 mm can be reached. These crystals exhibit slanted sidewalls and V-pits on the surface. Moreover, the crystal lattice has a concave curvature of approximately 5.4 m and a dislocation density of $6 \times 10^{-5}$ $cm^{-2}$. US 2009/0092815 A1 describes the production of aluminium nitride crystals having a thickness between 1 and 2 mm as well as aluminium nitride layers having a thickness of 5 mm. These layers are described as crack-free and can be used to cut colourless and optically transparent wafers having a usable area of more than 90% for the application in the production of devices and components.

The processes in the above-described prior art have in common that after growth and cooling-down III-N crystals are obtained which are subjected to strong extrinsic and intrinsic stress, whereby cracks or other material defects can develop, which limit the material quality and the processability towards III-N substrates.

SUMMARY OF THE INVENTION

The object of the present invention is to provide production processes for templates and III-N crystals that enable growth of III-N crystals under conditions which minimize the inclusion of material defects and improve the crystal quality as well as the processability.

This object is solved by processes provided hereinbelow. Furthermore, the present invention provides III-N single crystals adhering to a foreign substrate, as provided hereinbelow. Beneficial uses are defined hereinbelow.

According to the present invention it was surprisingly found that III-N single crystals can be grown crack-free and under controllable compressive stress in case crystal growth is carried out on a substrate at a first crystal growth temperature and subsequently the temperature applied before is changed to a second temperature, and if then further crystal growth occurs within the range of the second temperature which is changed compared with the first crystal growth temperature. The way how the temperature applied is changed depends on the kind of the substrate chosen for the process. If the substrate has a higher thermal expansion coefficient compared with the III-N single crystal to be grown, then the change to be applied is a reduction of temperature below the first temperature applied before. However, if the substrate has a lower thermal expansion coefficient compared with the III-N single crystal to be grown, then the change to be applied is a raising of temperature above the first temperature applied before.

Thereby, it is rendered possible that, according to the invention, in a template (i.e. a unit having substrate and a relatively thin III-N crystal layer, wherein such a template-unit on its part serves as starting product for the subsequent production of III-N crystal boules/ingots or of III-N devices) the critical parameters curvature and stress of the template, which have been identified to be important, can be influenced properly and systematically for advantageous characteristics of the template and its further use, whereby especially a later crack formation using the template according to the present invention can be efficiently counter-acted. According to alternative technical solutions, for settings relevant to the present invention and favourable for the further processing of the template it has to be made sure that (i) a curvature difference $(K_s-K_e)$ to be further specified later is held within the range of $\geq 0$ and in particular $>0$ during at least one growth phase during the template production, or (ii) the produced template in the status at growth temperature is not bowed or essentially not bowed or is negatively (convexly) bowed. According to the present invention templates can be produced which under epitaxial crystal growth conditions exhibit no or almost no curvature or a negative curvature and thus only a slight intrinsic stress which proved to be advantageous as starting situation for the further processing.

Accordingly, the process according to the present invention and more significantly by observation of the preferred features of the process according to the present invention allow an advantageous setting of the strain in the III-N crystal layer of the template with an $\epsilon_{xx}$ value at room temperature in an advantageous range of $\epsilon_{xx}<0$, especially of particularly suitable negative $\epsilon_{xx}$ values, which has a very favourable effect on the further processing of the template according to the present invention and which thus constitutes an alternative relevant product feature of the template according to the present invention.

Conventional processes so far have shown a completely different behaviour. In conventional processes, crystal growth is also carried out at a certain, desired temperature. This temperature correlates with a temperature deemed suitable for the respective III-N material. Even if it may happened that the temperature is reduced in a growth process in order to grow another III-N material, nevertheless, at this specific, new temperature at the beginning or during growth is not further reduced, but is kept constant. However, in such a conventional case, a given curvature of the growth surface, irrespective whether convex or concave, typically continuously increases during the growth. Surprisingly, the process according to the present invention can be arranged such that during a particular growth phase of the III-N material layer of the template a given curvature decreases despite the further growth of the given III-N material layer. Furthermore, as a result of a continuously increasing curvature in conventional processes a corresponding increasing intrinsic—typically tensile—stress within the crystal is built up, which optionally already during the further growth, at the latest during the cooling-down from the epitaxial growth temperature, can lead to micro-cracks and even to breaking. By contrast, in the process according to the present invention an intrinsic—typically compressive—stress can be kept low, such that during the continued growth and even during the cooling cracks can be avoided, that is, crack-free growth of III-N crystals can be attained.

As an alternative new possibility, optionally to be applied in combination, to favourably influence and to set under appropriate conditions, according to the invention, the above-described favourable curvature difference $(K_s-K_e)$ and/or non-curvature, the essentially non-curvature or the negative (convex) curvature is based on the procedural measure that during the growth, or in an intermittent intermediate stage at the beginning or between the beginning and continuation of the growth, of a crystalline III-N material on the substrate a mask material is deposited as interlayer on the substrate, which optionally exhibits a III-N nucleation layer, or in the actual crystalline III-N material at a specific maximum distance from the substrate, or respectively from the optionally provided III-N nucleation layer, and subsequently the growth of the crystalline III-N material is carried out or continued. The interlayer of the mask material, which is preferably formed as a single thin, generally very thin layer and the constitution of which will be further described below, is deposited at a maximum distance from the substrate, or respectively from the optionally provided III-N nucleation layer, of 300 nm, preferably at a distance of below 300 nm, more preferably below 250 nm, even more below 100 nm, in particular up to a maximum of 50 nm. In this alternative method of the designated setting of the curvature behaviour it is paid attention to that mask material as interlayer is deposited at least in part directly on the substrate or on the optionally present III-N nucleation layer (i.e. immediately adjacent), or in the crystalline material of the template at a suitable distance to the main surface of the substrate or the optionally present III-N nucleation layer (i.e. at the location where the contact with substrate or respectively III-N nucleation layer occurs). This applies also in a case when optionally surface structurings are provided on the substrate and thus the prescribed contact occurs only partly; such surface structurings namely relate merely to conventional patternings performed ex situ, such as for example the opening of windows, the formation of stripes or dots and other mask structures, for example by (photo) lithography, thus conventional cases in which the desirable curvature behaviour cannot be set as according to the invention. Furthermore, the dimensions are different: surface maskings and patterning performed ex situ typically exhibit a thickness dimension in the pm range, whereas the in situ provided mask material interlayer, which according to the invention is applied optionally or supplementarily, typically exhibits a thickness dimension in the sub-pm range.

In a III-N crystal according to the invention it can be avoided that cracks develop, which limit the material quality and/or the processability to III-N substrates. "Crack-free III-N crystal" according to the present invention denotes that it exhibits no crack on an area of 15 cm² (with 2 inch; 3 mm margin exclusion) at inspection of respectively 30 mm² image sections with an optical microscope.

According to the present invention furthermore the microscopic property of the deformation (strain) $\epsilon_{xx}$ of the lattice constant a can be influenced. In mechanics the deformation E is generally also referred to as strain tensor, wherein $\epsilon_{xx}$ denotes its first component. For crystal lattices the strain Exx is defined as follows:

$$\varepsilon_{xx} = \frac{\text{lattice constant } a - \text{lattice constant } a_0}{\text{lattice constant } a_0}$$

wherein a is the actual lattice constant in the crystal and ao presents the theoretical ideal lattice constant, wherein for $a_0$ typically a literature value of 3.1892±0.00004 Å can be assumed (according to V. Darakchieva, B. Monemar, A. Usui, M. Saenger, M. Schubert, Journal of Crystal Growth 310 (2008) 959-965).

Accordingly, the actually present crystal lattice constants can be influenced by epitaxial growth of crystal layers under extrinsic stress. For example, a compressive stress can be transferred or imposed to the growing crystal by extrinsic stress, whereby, compared to growth without stress, lattice constants within the growth plane are contracted. Thereby intrinsic stress is built up within the crystal in a controlled and purposive manner, wherein said stress favourably influences the above-mentioned properties of deformation and stress at continued or subsequent crystal growth.

Such templates are excellently suited as starting products for growing further epitaxial layers of the III-N system, in particular for producing thick III-N layers and III-N boules (bulk crystals). According to the invention, it is preferred that III-N crystals of templates according to the present invention have a $\epsilon_{xx}$ value in the range of <0.

Without limiting the invention, in the following a compilation of items is given, which describe aspects, further embodiments and particular features of the present invention:

1. A process for producing a template comprising a substrate and at least one III-N crystal layer, wherein III denotes at least one element of the third main group of the periodic table of the elements, selected from Al, Ga and In, the process comprising the following steps:
a) providing a substrate,
b) carrying out of growth of a crystalline III-N material on the substrate at a first crystal growth temperature,
c) changing the temperature to a second temperature which is changed compared with the first crystal growth temperature, at which however crystal growth can occur,
d) continuing crystal growth for forming of
   III-N crystal within a range changed compared with the first growth temperature, without adding In in this step d),
with the proviso that the second temperature in step c) is lower than the first temperature and in step d) the crystal growth is continued below the first growth temperature, if the substrate used has a higher thermal expansion coefficient than the III-N crystal to be grown until step d),
or that the second temperature in step c) is higher than the first temperature and in step d) the crystal growth is continued above the first growth temperature, if the substrate used has a lower thermal expansion coefficient than the III-N crystal to be grown until step d).

2. A process for producing a III-N single crystal, wherein III denotes at least one element of the third main group of the periodic table of the elements, selected from the group consisting of Al, Ga and In, the process comprising the following steps:
a) providing a substrate,
b) carrying out of growth of a crystalline III-N material on the substrate at a first crystal growth temperature,
c) changing the temperature to a second temperature which is changed compared with the first crystal growth .temperature, at which however crystal growth can occur,
d) continuing crystal growth for forming of
   III-N crystal within a range changed compared with the first crystal growth temperature, without adding In in this step d),
with the proviso that the second temperature in step c) is lower than the first temperature and in step d) the crystal growth is continued below the first growth temperature, if the substrate used has a higher thermal expansion coefficient than the III-N crystal to be grown until step d),
or that the second temperature in step c) is higher than. the first temperature and in step d) the crystal growth is continued above the first growth temperature, if the substrate used has a lower thermal expansion coefficient than the III-N crystal to be grown until step d),
e) additional epitaxial crystal growth for forming of III-N crystal at a crystal growth temperature which can be selected independently from said first and second temperatures, wherein optionally, in this step e) In may be added, and
f) optionally separating of formed III-N single crystal and substrate.

3. The process according to item 1 or 2, characterized in that in the steps b) to d), MOVPE is used as growth method.

4. The process according to any one of the preceding items, characterized in that in step c), the change, i.e. lowering or raising of the temperature, sets a temperature difference ΔT ($T_1$-$T_2$) within a reactor, which value is at least at 10° C., in particular in the range of 10-100° C., preferably at least at 20° C., more preferably within the range of 20-50° C., even more preferably within the range of 25-40° C. and in particular at 30° C.

5. The process according to any one of the preceding items, characterized in that the first growth temperature in the reactor is within the range of 1000-1100° C., preferably at 1020-1080° C., more preferably at about 1040° C.

6. The process according to any one of the preceding items, characterized in that in step b), III-N crystallites groW vertically and laterally.

7. The process according to any one of the preceding items, characterized in that in step c), at a point of time when crystallite coalescence starts, the temperature is changed and that subsequent to said change in temperature, an epitaxial crystal growth proceeds over the coalescing III-N crystallite, as the case may be set within the range below or above the first growth temperature.

8. The process according to any one of the preceding items, characterized in that in step c), the temperature is lowered to a second temperature within the reactor lying within the range of 950-1050° C., preferably at 990-1030° C., more preferably at about 1010° C.

9. The process according to any one of the preceding items, characterized in that in step d), the growth temperature is below the first growth temperature within the range of 950-1075° C., preferably of 975-1050° C., more preferably of 990 to 1030° C.

10. The process according to any one of the preceding items, characterized in that after the lowering of temperature, the growth temperature for the further growth in step d) is substantially kept constant.

11. The process according to any one of the preceding items, characterized in that during the growth phase in step d), i.e. during formation of a III-N material layer, at growth temperature a given curvature of the growth surface decreases continually or intermittently.

12. The process according to any one of the preceding items, characterized in that in step b), a concave curvature of the growth surface is caused and that in step c), by changing the temperature of the growth surface, the concave curvature becomes smaller compared with the curvature before the changing, or the curvature is eliminated.

13. The process according to any one of the preceding items, characterized in that the curvature difference ($K_s-K_e$) of the template has a positive algebraic sign at the beginning (curvature value $K_s$) and at the end (curvature value $K_e$) of step d).

14. The process according to any one of the'preceding items, characterized in that the curvature difference ($K_s-K_e$) is at least 5 km$^{-1}$, more preferably at least 10 km$^{-1}$.

15. The process according to any one of the preceding items, characterized in that the curvature difference ($K_s-K_e$) is at most 50 km$^{-1}$, preferably at most 20 km$^{-1}$.

16. The process according to any one of the preceding items, characterized in that after completion of step; d), the substrate is not or essentially not curved or is negatively curved, preferably the curvature ($K_e$) is within the range of at most 30 km$^{-1}$.

17. The process according to any one of the preceding items, characterized in that after completion of step d) the substrate is essentially not curved, wherein the curvature ($K_e$) preferably lies in the range of ±30 km$^{-1}$.

18. The process according to any one of the preceding items, characterized in that the steps b) to d) are carried out in the growth of only a single (i.e. one and the same) III-N layer of the substrate.

19. The process according to any one of the preceding items, characterized in that after completion of step d), a III-N layer having a thickness within the range of up to 25 μm, preferably 0.1-10 μm, more preferably 2-5 μm is deposited onto the substrate.

20. A process for producing a III-N single crystal, wherein III denotes at least one element of the third main group of the periodic table of the elements, selected from Al, Ga and In, the process comprising the following steps:
aa) providing a template comprising a foreign substrate and at least one III-N crystal layer, wherein within a temperature range of an epitaxial crystal growth, the template is not or essentially not curved or is negatively curved,
bb) carrying out epitaxial crystal growth of a III-N crystal at a crystal growth temperature at which the template is not or essentially not curved or is negatively curved, wherein it is preferred that in steps aa) and bb), no In is added, and
cc) optionally additional epitaxial crystal growth for forming of a III-N crystal at a crystal growth temperature which can be set independently from said crystal growth temperature of step bb), wherein optionally, in this step cc) indium may be added, and
dd) furthermore, optionally separating III-N single crystal and foreign substrate.

21. The process according to item 20, characterized in that after completion of step bb) the proviso of "essentially not curved" or "negatively curved" means that the curvature ($K_e$) is within the range of at most 30 km$^{-1}$.

22. The process according to item 21, characterized in that the template is essentially not curved, wherein the curvature ($K_e$) preferably lies in the range of ±30 km$^{-1}$.

23. The process according to any one of the preceding items, characterized in that the substrate used in step a) or respectively aa) is a foreign substrate having a higher thermal expansion coefficient than the III-N crystal to be grown, selected from the group consisting of LiAlO$_2$ and sapphire, preferably sapphire.

24. The process according to any one of the preceding items, characterized in that the substrate used in step a) or respectively aa) is a foreign substrate having a lower thermal expansion coefficient than the III-N crystal to be grown, selected from the group consisting of SiC and Si.

25. The process according to any one of items 20 to 24, characterized in that in step aa) the at least one III-N crystal layer contains no indium, and/or that in step bb) during the epitaxial crystal growth of III-N crystal no indium is added.

26. The process according to any one of items 20 to 25, characterized in that the template provided in step aa) is produced by a process according to any one of items 1 to 19.

27. The process according to any one of items 20 to 26, characterized in that the template provided in step aa) is produced in that during the growth, or in an intermittent intermediate stage at the beginning or between the beginning and continuation of the growth, of a crystalline III-N material for said III-N crystal layer on the substrate a mask material is deposited as interlayer on the substrate, which optionally exhibits a III-N nucleation layer, or in the crystalline III-N material itself at a maximum distance from the substrate, or respectively from the optionally provided III-N nucleation layer, of 300 nm, preferably at a distance of below 100 nm, more preferably of up to a maximum of 50 nm, and subsequently the growth of the crystalline III-N material for said III-N crystal layer is carried out or continued.

28. The process according to item 27, characterized in that the mask material is a material which is different from the substrate material and III-N material, on which the III-N growth is inhibited, disturbed or prevented, wherein the mask material is preferably selected from the group consisting of Si$_x$N$_y$ (wherein x and y respectively independently from each other denote positive numbers which lead to stoichiometric or nonstoichiometric SiN compounds; in particular Si$_3$N$_4$), TiN, Al$_x$O$_y$ (wherein x and y respectively independently from each other denote positive numbers which lead to stoichiometric or nonstoichiometric AlO compounds; in particular Al$_2$O$_3$), Si$_x$O$_y$ (wherein x and y respectively independently from each other denote positive numbers which lead to stoichiometric or nonstoichiometric SiO compounds; in particular $SiO_2$), WSi, and WSiN.

29. The process according to item 27 or 28, characterized in that the interlayer is formed as a single layer, and/or that the thickness of the interlayer lies in the nanometer or sub-nanometer range, for example below 5 nm, more preferably below 1 nm, in particular down to below one monolayer (i.e. 0.2 to 0.3 nm or less).

30. The process according to any one of items 20 to 29, characterized in that the curvature behaviour of the provided template designated in step aa) is set in the growth of only a single III-N layer of the template.

31. The process according to any one of the preceding items, characterized in that the starting substrate in step a) or respectively aa) has a polished surface. 32. The process according to any one of the preceding items, characterized in that the starting substrate in step a) or respectively aa) exhibits a surface structured by lithography or wet chemical etching or dry chemical etching (e.g. ICP).

33. The process for preparing a III-N single crystal according to any one of the preceding items, characterized in that the crystal growth at least in step e) of item 2 or in optional step cc) of item 20—optionally in all crystal growth steps—is carried out via HYPE.

34. The process for preparing a III-N single crystal according to any one of items 2 to 33, characterized in that after completion of the epitaxial growth, III-N single crystals are grown having layer thicknesses of at least 0.5 mm, preferably of at least 1 mm, more preferably of at least 5 mm, in particular of at least 7 mm and most preferably of at least 1 cm.

35. The process for preparing a III-N single crystal according to any one of the preceding items, characterized in that at least one and optionally more GaN-, AlN-, AlGaN-, InN-, InGaN-, AlInN- or AlInGaN-layer(s) is/(are) deposited for preparing accordingly thicker III-N layers or III-N single crystals.

36. The process for preparing a III-N single crystal according to any one of the preceding items, characterized in that the III-N crystal layer on the substrate as well as the thereon epitaxially grown III-N crystal are composed of the same III-N material.

37. The process for preparing a III-N single crystal according to any one of the preceding items, characterized in that at the III-N crystal layer on the substrate as well as on the thereon epitaxially grown III-N crystal, no exchange was carried out for the III-component.

38. The process for preparing a III-N single crystal according to any one of the preceding items, characterized in that the III-N crystal layer on the substrate as well as the thereon epitaxially grown III-N crystal respectively form a binary system.

39. The process for preparing a III-N single crystal according to items 2 to 38, characterized in that the optional separating III-N single crystal and substrate takes place by self-separation, preferably during cooling from a crystal growth temperature.

40. The process for preparing a III-N single crystal according to any one of items 2 to 38, characterized in that the optional separating III-N single crystal and substrate takes place by means of grinding-off, sawing-off or a lift-off process.

41. The process for preparing a III-N single crystal according to any one of the preceding items, characterized in that the substrate and the at least one III-N crystal layer is formed such that the III-N crystal layer surface has a convex curvature at room temperature.

42. The process for preparing a III-N single crystal according to any one of the preceding items, characterized in that within the temperature range of an epitaxial crystal growth, the III-N single crystal has a value of $\epsilon_{xx} \leq 0$, preferably a value of $\epsilon_{xx} < 0$.

43. The process for preparing a III-N single crystal according to any one of the preceding items, characterized in that the III-N single crystal has a radius within the range of −4 to −6 m at room temperature.

44. The process for preparing a III-N single crystal according to any one of the preceding items, characterized in that the III-N single crystal has a compressive stress of $\sigma_{xx} < -0.70$ GPa at room temperature.

45. The process for preparing a III-N single crystal according to any one of the preceding items, characterized in that when sapphire of a thickness of 430 µm is used as a substrate and GaN of a thickness of 3.5 µm is used as III-N crystal layer, the III-N single crystal has a curvature of $K_T < -170$ km$^{-1}$ at room temperature, preferably within the range of $-170$ km$^{-1} > K_T > -250$ km$^{-1}$, wherein when using or setting other layer thicknesses, the curvature value lies depending on the respective layer thicknesses analogous to the Stoney equation in the following range:

$$K_T(d_{GaN}; d_{sapphire}) = K_T(3.5 \text{ µm}; 430 \text{ µm}) \times (430 \text{ µm}/d_{sapphire})^2 \times (d_{GaN}/3.5 \text{ µm}).$$

46. The process for preparing a III-N single crystal according to any one of the preceding items, characterized in that the III-N single crystal has a value $\epsilon_{xx} \leq -0.002$ at room temperature, preferably a value $\epsilon_{xx}$ within the range of $-0.002$ to $-0.004$.

47. A process for producing III-N crystal wafers, wherein III denotes at least one element of the third main group of the periodic table of the elements, selected from Al, Ga and In, the process comprising the following steps:
a) carrying out a process according to items 2 to 46 for forming a III-N single crystal, and
b) separating the single crystals for forming wafers, optionally a plurality of wafers.

48. A III-N single crystal adhering to a foreign substrate, wherein III denotes at least one element of the third main group of the periodic table of the elements, selected from Al, Ga and In, characterized in that the III-N single crystal is defined by one or both of the following values (i)/(ii) of the deformation $\epsilon_{xx}$:
(i) at room temperature the cxx-value lies in the range of <0, preferably the cxx-value lies in the range $\epsilon_{xx} \leq -0.002$;
(ii) within a temperature range in which an epitaxial crystal growth of any material and in particular III-N material would occur, the $\epsilon_{xx}$-value is $\leq 0$, preferably $\epsilon_{xx}$ is <0.

49. The III-N single crystal according to item 48, characterized in that cxx at room temperature lies within the range of $-0.002$ to $-0.004$.

50. The III-N single crystal according to item 48 or 49 in the form of a template having a layer thickness of the III-N single crystal within the range of up to at most 25 µm, preferably of 0.1 to 10 µm, more preferably 2 to 5 µm.

51. The III-N single crystal according to any one of the preceding items, characterized in that the III-N single crystal has a compressive stress of $\sigma_{xx} < -0.70$ GPa at room temperature.

52. The III-N single crystal according to any one of the preceding items, characterized in that the foreign substrate is selected from the group consisting of SiC, Si, $LiAlO_2$ and sapphire, preferably it comprises sapphire, and more preferably it consists of sapphire.

53. The III-N single crystal according to any one of the preceding items having sapphire as foreign substrate and GaN as III-N single crystal, characterized in that when the sapphire has a thickness of 430 μm and the GaN-layer has a thickness of 3.5 μm, there is a curvature $K_T < -170 \text{ km}^{-1}$ at room temperature, preferably within the range of $-170 \text{ km}^{-1} > K_T > -250 \text{ km}^{-1}$, wherein when there are other layer thicknesses of the sapphire and/or the GaN-layer, the curvature value lies depending on the respective layer thicknesses analogous to the Stoney equation in the following range:

$$K_T(d_{GaN}; d_{sapphire}) = K_T(3.5 \text{ μm}; 430 \text{ μm}) \times (430 \text{ μm}/d_{sapphire})^2 \times (d_{GaN}/3.5 \text{ μm}).$$

54. The III-N single crystal according to any one of items 46 to 51, characterized in that III denotes Ga and the crystal in growth direction exhibits a lattice constant within the range of $a < 0.318926$ nm, for example in the range of $0.31829 \text{ nm} < a < 0.318926 \text{ nm}$.

55. The III-N single crystal according to any one of the preceding items, characterized in that the foreign substrate is removed.

56. The III-N single crystal according to any one of items 48 to 54, characterized in that the crystal is prepared according to the process according to items 2 to 46.

57. Use of a III-N single crystal or template according to any one of items 48 to 56 for preparing of thicker III-N layers or III-N crystal boules or bulk crystals, which are thereafter optionally separated into individual III-N wafers.

58. Use of a III-N single crystal or template according to any one of items 48 to 56 for preparing semiconductor elements or electronic and optoelectronic devices.

59. The use according to item 58 for preparing power components, high-frequency components, light-emitting diodes and lasers.

BRIEF DESCRIPTION OF THE FIGURES

FIG. 1 schematically shows different stages of the growth process for forming a III-N template according to one embodiment of the present invention;

FIG. 6 schematically shows further embodiments with which alternatively templates can be provided whose stress can be set purposively and quantitatively exactly by providing and positioning in the correct location an interlayer with mask material at respectively suitable stages of the growth process for forming of III-N templates;

FIGS. 7A and 7B show the change of the curvature of the growth surface mainly in dependence on the provision and location/positioning of an interlayer with mask material according to different possible embodiments of the present invention, in comparison to comparative examples.

Figure 2:
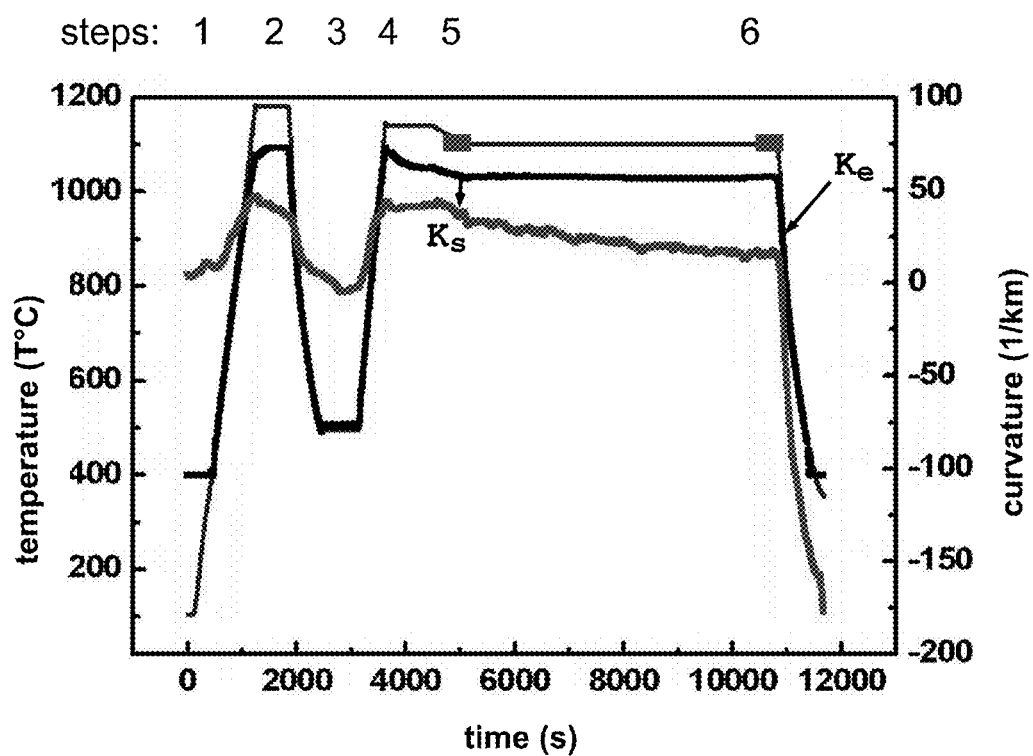
FIG. 2 shows the change of the curvature of the growth surface depending on process step (thereby, the numbers 1 to 6 correspond to steps (i) to (vi) of the FIG. 1) and respectively applied temperature by way of the example of the deposition of GaN onto sapphire according to a possible embodiment.

Without thus limiting the present invention, the following detailed description of the figures, aspects, further embodiments and particular features will clearly illustrate the invention and describe particular embodiments in detail.

DETAILED DESCRIPTION

In the process for producing III-N starting substrates it was surprisingly found that templates comprising a foreign substrate and at least one III-N crystal layer, wherein III denotes at least one element of the third main group of the periodic table of elements, selected from the group consisting of Al, Ga and In, can be produced which render possible the growth of III-N single crystals having excellent properties.

In a first embodiment, first, a substrate is provided for the production of a such template. A suitable substrate may be selected from a group consisting of a homo- or hetero-starting substrate, a starting substrate having a layer of grown III-N crystallites as well as a starting substrate having structures formed thereon, for example specific, prepared III-N structures and/or mask structures. According to an embodiment according to the invention shown in FIG. 1, the process according to the invention comprises the provision of the substrate by means of steps (i) to (iii). Accordingly, first, a starting substrate (i) is provided which is subjected to a desorption step (ii) and a nucleation step (iii).

For the provision of a starting substrate a foreign substrate is preferably suited which for example is made of SiC, silicon, LiAlO$_2$ or sapphire, particularly preferably is composed of sapphire. More preferably a c-plane sapphire substrate is used having a tilt towards (1-100) or (11-20) by 0.1-0.5° and a one-sided epi-ready polishing and a polished and/or preferably lapped backside. A further embodiment provides for the starting substrate to exhibit a surface structured by lithography or wet chemical or dry chemical etching (e.g. ICP etching). The use of a foreign substrate as starting substrate is of particular advantage, since the material of the foreign substrate and the grown III-N material have different thermal expansion coefficients, such that at change in temperature, a curvature of the substrate, specifically of the growth surface, is effected and that this is particularly suitable as starting situation for the process according to the invention. However, for the present invention, a homo-subsrate can also be used as starting substrate, wherein in this case, a curvature can be introduced for example by the temperature gradients within the starting material. A further possibility is that a homo-starting substrate is used onto which an—optionally structured—foreign masking layer is subsequently deposited which may result in a change of the curvature of the substrate at change in temperature.

A further possibility of providing a suitable starting substrate can comprise the formation of interlayers or intermediate structures for the purpose of supporting the later separation from the starting substrate, and/or the formation of a so-called GaN "nano grass" which is based on a substrate having formed thereon a GaN compliance layer having nano-column structure, as for example described in WO 2006035212 A1, WO 2008096168 A1, WO 2008087452 A1, EP 2136390 A2 and WO 2007107757 A2.

Optionally, the starting substrate may be further pre-treated. As illustrated in FIG. 1 (ii), a desorption step is preferably carried out with the provided starting substrate. In this desorption step for example hydrocarbon residues but also other volatile contaminants can be removed from the starting substrate or a structured or otherwise pre-treated substrate. During the desorption step the starting substrate is heated in the process to an elevated temperature, preferably to a temperature of 1000 to 1200° C., more preferably to a temperature of 1050 to 1150° C., for example approximately about 1090° C. Thereby, due to the temperature gradient within the substrate, for instance due to a directed heating (typically e.g. by means of a heating from the substrate side of the substrate holder or respectively the deposition, which is opposite to the growing surface) the starting substrate is subjected to a bending, typically with a negative curvature (concave) with respect to the surface onto which subsequently the III-N material is deposited (cf. FIG. 1). The desorption step may further comprise a nitriding with ammonia. A further optional step consists of lowering the temperature after desorption occurred, for example to a temperature between 400 and 600° C., preferably to a temperature between 450 and 550° C. During this cooling the—preferably concave—curvature decreases again, for example to the level like in the beginning of the heating to the desorption step.

The provision and the pre-treatment of a substrate in the process for producing a template of the present invention may preferably further comprise a nucleation step in which crystalline III-N material, especially minute III-N crystallites are grown onto the starting substrate. This step is schematically illustrated in FIG. 1 (iii). The crystalline III-N material, especially the III-N crystallites serve as seed crystals in the later crystal growth process step. III-N crystallites exhibit sizes of e.g. 1 to 40 nm with irregular forms, are generally present disorderedly on the starting substrate and suitably form initially a non-continuous nucleation layer. This nucleation step typically takes place at temperatures of 400 to 600° C., preferably of 450 to 550° C. and more preferably of 500 to 540° C. Since the temperature for a nucleation is typically lower than that for an optional preceding desorption, the curvature will decrease from step (ii) to (iii). The state of the provided substrate in step (iii) is thus typically to describe by a relatively low curvature or even (as schematically illustrated in FIG. 1) a missing curvature.

After the provision of a substrate, optionally by the above described optional means, such as a nucleation step, that is after the step a) according to the invention, an increase of temperature takes place then to a temperature enabling crystal growth for forming a III-layer. According to the definition of the present invention, the temperature in this stadium is termed "first" crystal growth temperature of step b) according to the invention; this definition applies independent therefrom and does not exclude that an increased temperature was applied before, for example in order to carry out pre-treatment, structuring or other processing of the starting material. During the crystal growth at a such first growth temperature, optionally already during the heating up carried out for increase of temperature, typically a rearrangement process of III-N seeds takes place wherein smaller seeds disappear in favour of bigger seeds, gaps form (future vacant lattice positions or voids at the boundary surface) and the hexagonal habitus of the seeds which is merely indicated before in the nucleation step is now markedly increased. A such step according to the present embodiment is illustrated in FIG. 1 (iv). As schematically indicated in particular in step (iv) of FIG. 1, due to enlargement or coalescence of the III-N seeds and in the course of the forming layer, there is a curvature in growth direction, that is to say in a concave range. The said "first" growth temperature within the reactor is within a temperature range at which good growth conditions of the respective III-N materials exist. In the case of GaN, this "first" growth temperature is for example within the range of 990-1090° C., preferably at 1020-1060° C., and more preferably at about 1040° C. In the case of AlGaN having an Al-content of 30% to up to 90%, the "first" growth temperature is for example within the range of 1070-1250° C., preferably at 1090-1130° C., and more preferably at 1110° C.

At this first growth temperature, growth of crystalline III-N material onto the substrate takes place. III-N crystallites are growing vertically and laterally. This vertical and lateral growth of the III-N crystallites renders possible at sufficient crystallisation time that coalescence of the crystallites occurs. During the crystal growth at the first crystal growth temperature, the curvature of the substrate increases. The direction or respectively the algebraic sign of the distortion/curvature is defined relative to the surface onto which the III-N material is subsequently deposited. A curvature increasing with the temperature readily takes place in the case of the use of a foreign substrate due to the different thermal extension coefficients of foreign substrate and III-N material to be grown. Thereby, the conditions, for instance by selection of a used foreign substrate relative to the formed III-N material can be typically selected such that a concave curvature increases thereby.

In the case of the use of a homo-substrate, curvature takes place for example due to temperature gradients within the substrate.

According to the invention, then, for systematic and specific influencing of the further curvature development of the template, the growth temperature is changed according to step c) according to the invention in this embodiment. Accordingly, in the case of using sapphire or $LiAlO_2$ as foreign substrate, the temperature is lowered, and on the other hand, in the case of using SiC or Si the temperature is raised. This takes place preferably at the beginning or during the coalescence of the growing III-N crystallite. However, in this step the temperature is maximally changed (i.e. lowered or respectively raised) to an extent that crystal growth and preferably epitaxial crystal growth can further take place. Owing to the change in temperature, the growth process does not need to be interrupted. Then, subsequent to the change in temperature on the coalescing III-N crystallites, an epitaxial crystal growth takes place in a second temperature range. The change (i.e. lowering or raising) of the temperature sets a temperature difference $\Delta T$ (first growth temperature T1 minus second growth temperature T2) within the reactor, which value is at least 10° C., in particular in the range of 10-100° C., preferably at least at 20° C., more preferably within the range of 20-50° C., even more preferably within the range of 25-40° C. and in particular at 30° C.

Accordingly, in the case of the growth of GaN a temperature $T_1$ is present within the reactor which is within the range of 990-1090° C., preferably of 1.020-1060° C., and more preferably at about 1040° C.

Accordingly, the second growth temperature $T_2$ when using for example sapphire or $LiAlO_2$ as foreign substrate is at $T_2$ lowered compared with the specifically selected temperature $T_1$ within the range of 950-1050° C., preferably of 990-1030° C., more preferably at about 1010° C.; on the other hand, when using SiC or Si as foreign substrate, the second growth temperature $T_2$ is lowered compared with the specifically selected temperature $T_1$ within the range of 1030-1130° C., preferably of 1050-1110° C., more preferably at about 1060° C. In the case of the growth of AlGaN having an Al-content of up to 30%, a temperature $T_1$ within the reactor is within the range of 1010-1110° C., preferably of 1040-1080° C., more preferably of about 1060° C. Accordingly, when using for example sapphire or $LiAlO_2$ as foreign substrate, the second growth temperature $T_2$ is lowered compared with the specifically selected temperature $T_1$ within the range of 970-1070° C., preferably of 1010-1050° C., more preferably at about 1030° C.; on the other hand, when using SiC or Si as foreign substrate, the second growth temperature $T_2$ is lowered compared with the specifically selected temperature $T_1$ within the range of 1.050-1150° C., preferably of 1060-1100° C., more preferably at about 1080° C.

In the case of the growth of AlGaN having an Al-content of 30% to up to 90%, a temperature $T_1$ within the reactor is within the range of 1070-1250° C., preferably of 1090-1130° C., more preferably of about 1110° C. Accordingly, the second temperature $T_2$ when using for example sapphire or $LiAlO_2$ as foreign substrate is lowered compared with the specifically selected temperature $T_1$ within the range of 1040-1220° C., preferably of 1060-1100° C., more preferably at about 1080° C.; on the other hand, when using SiC or Si as foreign substrate, the second growth temperature $T_2$ is lowered compared with the specifically selected temperature $T_1$ within the range of 1080-1250° C., preferably of 1090-1150° C., more preferably at about 1120° C.

While the curvature of the crystalline growth surface which was present during growth of crystalline III-N material onto the substrate at the first crystal growth temperature is decreased by changing the growth temperature, it was surprisingly found that when continuing the epitaxial crystal growth within the range of the second growth temperature—i.e. depending on the used substrate below or above the first crystal growth temperature—the curvature of the growth surface does not increase again, but at least keeps constant, preferably further decreases continually or intermittently. In a preferred embodiment, a concave curvature of the growth surface decreases at changed growth temperature at continued growth. Thus, in contrast to conventional processes, the curvature decreases despite of growth at the second growth temperature. The second growth temperature may vary within the prescribed, however changed range compared with the first growth temperature, or it may be kept constant at a specific temperature within the changed temperature range.

When the curvature value at the beginning of the crystal growth at the second growth temperature is denoted "$K_s$" ($K_{start}$) and the curvature value at a later point of time and in particular towards the end of the growth of the III-N layer of the template is denoted "$K_e$" ($K_{end}$), then the curvature difference ($K_s-K_e$) of the template exhibits a positive algebraic sign. Preferably, $K_s-K_e$ is at least 5 km$^{-1}$, more preferably at least 10 km$^{-1}$. On the other hand the curvature difference ($K_s-K_e$) should not be larger than 50 km$^{-1}$, more preferably not be larger than 20 km$^{-1}$.

By recognizing this behaviour and the correlations involved therewith, by means of the process of the present invention it is possible to produce a template comprising a first III-N layer which exhibits no or almost no (substantially no) curvature or is negatively curved. The term "almost no" or respectively "essentially no" curvature is preferably defined such that the curvature value ($K_e$) at epitaxial growth temperature is within the range of at most ±30 km$^{-1}$.

As can be seen from the above description, according to the invention the curvature behaviour can be advantageously influenced and set already in the growth of a single (i.e. one and the same) III-N layer of the template. In particular, the exerting of influence on the curvature behaviour is carried out in the denoted steps b) to d) to accordingly generate a single III-N layer of the template. Step d) can be carried out subsequently independently from the described conditions.

Without wishing the present invention to be bound to any theory, it is assumed that in the phase of the coalescence of the first III-N layer, i.e. that short before, at the beginning or shortly after the coalescence, the density of the seeds on the surface becomes so large that a closed surface is more favourable for energetic reasons, wherein by means of the expansion of the crystallites taking place in the growth plane, a tensile stress is built up (FIG. 1 (iv)). By means of the described change of the temperature, optionally upon presence of a foreign substrate also by means of the different thermal extension coefficients of the starting substrate, the coalescing seeds are compressed within the plane such that the subsequent III-N crystal growth is offered a compressively stressed surface lattice. As a result of this compressive stress, the growing III-N crystal layer pushes back the foreign substrate and thereby effects a decrease of the curvature, preferably a decrease of the concave curvature (FIG. 1 (v)). This process may be continued until achieving a desired minor curvature or the absence of any curvature or even the generation of a negative curvature (FIG. 1 (vi)).

By continuing the growth at the second crystal growth temperature, further III-N material is epitaxially grown. The III-component of the III-N material can now basically be varied if desired, however, preferably attention should be paid to further conditions, in order to not interfere with the advantageous influencing on the curvature behaviour. In particular, the introduction of indium in this phase of the process has disadvantages and thus it is preferably refrained therefrom, since the growth of Indium-containing materials requires specific, particularly low growth temperatures, which result in bad crystal quality, possibly even segregation. In this phase of the growth at the "second" growth temperature, it is thus preferred to dispense with the addition of In.

Furthermore, in this phase of the growth it is preferred to carry out the growth within the range of the second growth temperature with III-N materials which, in the case if any aluminum shall be used, exhibit an aluminum-content of at most 60%, wherein furthermore, the content (in % of the III-component) within the III-N material of optionally present aluminum is preferably at most 30%, more preferably at most 20%, or only within the range of 10 to 0%. On the other hand, interesting applications having an aluminum content of more than 30% are also reasonable, for example within the range of 50 to 70%. Indeed, an extremely high aluminum content of more than 70% is basically possible, however, it is rather to be avoided, since such materials have an isolating character and do not suit well for application in optoelectronic components. It is further preferred that the III-component changes relatively little or rather does not change at all based on the preceding steps—for instance at the formation of the initial III-N crystallites onto the substrate as described above—up to the step of growth within the range of the second growth temperature; for example, it is desirable that in case the III-component is varied—if any, the change of the III-component is at most 10%. In a specific embodiment, the III-component is not changed within the phase of the growth within the range of the second growth temperature, and preferably the III-N material is GaN.

In the phase of the growth within the range of the second growth temperature, layer thicknesses of suitably at least 0.1 µm, for example within the range of 0.1-10 µm, preferably of 2-5 µm can be deposited onto the substrate.

In a preferred embodiment of the present invention, all crystal growth steps described above in the first embodiment, including the optionally performed nucleation step, are carried out via organometallic vapor phase epitaxy (MOVPE, Metal-Organic Vapor Phase Epitaxy). Alternatively or in combination, the crystal growth steps described before can however also be performed via HVPE.

By finishing the crystal growth at the second growth temperature, a template is provided according to the invention. The thus obtained template has advantageous characteristics and features, which will be further described in the following. As such it is an interesting commercial object, it can however also be further processed as template within further steps described below, directly subsequently or alternatively indirectly after providing, storing or shipping.

A template for producing further III-N single crystal according to the present invention has no or almost no curvature within the temperature range of an epitaxial crystal growth. When for substrate sapphire having a thickness ($d_{sapphire}$) of 430 µm and for III-N crystal layer of the template GaN of a thickness ($d_{GaN}$) of 3.5 µm is used or set, then the requirement "essentially no curvature" or "negative curvature" at epitaxial crystal growth temperature means that the template has a curvature $K_{T(3.5\ \mu m;430\ \mu m)} < -170$ km$^{-1}$ at room temperature, preferably within the range of $-170$ km$^{-1}$ > $K_T$ > $-250$ km$^{-1}$ (here, $K_T$ means the curvature of the surface of the template at room temperature), wherein when using or setting other layer thicknesses, the curvature value may vary depending on the respective layer thicknesses analogous to the following simplified Stoney equation, according to which—as long as the film ($d_{GaN}$) is significantly thinner than the substrate ($d_{substrate}$)—the following relationship applies, wherein R=curvature radius and $\epsilon_{xx}$=deformation (strain):

$$1/R = 6 * (d_{GaN}/d^2_{substrate}) * \epsilon_{xx}.$$

Assuming a very thin layer, $\epsilon_{xx}$ is considered to be constant, i.e. when the layer thicknesses change the system reacts with a change of R (the change of $\epsilon_{xx}$ resulting from a change of the curvature is neglected). Thus, the above (partially preferred) ranges applying for the case $K_{T(3.5\ \mu m;430\ \mu m)}$ of the curvature value at room temperature can be converted as follows in case other values apply for $d_{GaN}$ and $d_{substrate}$:

$$K_{T(dGaN;dsapphire)} = K_{T(3.5\ \mu m;430\ \mu m)} \times (430\ \mu m / d_{sapphire})^2 \times (d_{GaN}/3.5\ \mu m).$$

For a template according to the present invention this for example means that when for 430 µm of sapphire and for a 3.5-4 µm thick GaN layer a curvature of $-250$ km$^1$ is present, for the same process a curvature of $-425$ km$^{-1}$ results for a 330 µm sapphire.

In a further preferred embodiment, the template at room temperature exhibits a curvature radius within the range of $-4$ to $-6$ m for the case of $d_{sapphire}$=430 µm and $d_{GaN}$=3.5 µm.

Another possibility to characteristically describe the product- or structure-characteristics of the template obtained according to the present invention is to specify the strain of the lattice constants or the stress.

The strain $\epsilon_{xx}$ is defined as follows:

$$\varepsilon_{xx} = \frac{\text{lattice constant } a - \text{lattice constant } a_0}{\text{lattice constant } a_0}$$

wherein a denotes the actual lattice constant in the crystal and $a_0$ denotes the theoretical ideal lattice constant.

X-ray methods for determining absolute lattice constants are discussed in detail in M. A. Moram and M. E. Vickers, Rep. Prog. Phys. 72, 036502 (2009). Thereby the determination is carried out using Bragg's Law $$n\lambda = 2d_{h\ k\ l} \sin \theta$$

initially for the lattice constant c from a 2theta-scan with three-axes-geometry in symmetrical reflexes such as e.g. 004. The ideal lattice constant according to V. Darakchieva, B. Monemar, A. Usui, M. Saenger, M. Schubert, Journal of Crystal Growth 310 (2008) 959-965 is $c_0$=5.18523±0.00002 Å. The determination of the lattice constant a is then carried out using the equation, $$\frac{1}{d^2_{hkl}} = \frac{4}{3} \frac{h^2 + k^2 + hk}{a^2} + \frac{l^2}{c^2}$$

also given for example in M. A. Moram and M. E. Vickers, Rep. Prog. Phys. 72 (2009) 036502, from asymmetrical reflexes hkl such as for example $-105$ in the 2theta-scan. According to V. Darakchieva, B. Monemar, A. Usui, M. Saenger, M. Schubert, Journal of Crystal Growth 310 (2008) 959-965, the ideal lattice constant $a_0$ for unstressed GaN can be assumed to be $a_0$=3.18926±0.00004 Å. As to the background of the phenomena of intrinsic and extrinsic stress, among others considering lattice constants, cf. Hearne et al., . Appl. Physics Letters 74, 356-358 (2007).

Furthermore, the properties can also be given by the stress $\sigma_{xx}$, wherein $$\sigma_{xx} = M_f \epsilon_{xx} \quad \text{(Hooke's formula)}$$

wherein $M_f$ denotes the biaxial elastic modulus.

The determination of the stress $\sigma_{xx}$ is readily possible via Raman spectroscopy, for example as described in I. Ahmad, M. Holtz, N.N. Faleev, and H. Temkin, J. Appl. Phys. 95, 1692 (2004); therein the biaxial elastic modulus of 362 GPa is derived from the literature as a value, wherein a very similar value of 359 GPa can be taken from J. Shen, S. Johnston, S. Shang, T. Anderson, J. Cryst. Growth 6 (2002) 240; thus a suitable and consistent value for the biaxial elastic modulus $M_f$ is about 360 GPa.

A template according to the present invention exhibits in the temperature range of an epitaxial crystal growth a value of $\epsilon_{xx} \leq 0$ (i.e. including $\epsilon_{xx}$=0), but in particular of $\epsilon_{xx} < 0$. This value can be directly determined from an in situ measurement of the curvature.

The template according to the present invention further exhibits at room temperature a compressive stress of $\sigma_{xx} < -0.70$ GPa. The deformation $\epsilon_{xx}$ of the template at room temperature can be set to a value of $\epsilon_x \leq -0.002$ (in particular $< -0.002$), preferably within the range of $-0.002$ to $-0.004$.

A suitable curvature measurement device, which is applicable in combination with an apparatus for vapor phase epitaxy, is for example the curvature measurement device of Laytec AG, Seesener Strasse, Berlin, Germany (cf. for example DE102005023302 A1 and EP000002299236 A1).

These curvature measurement devices are well adapted to be combined with available equipments for vapor phase epitaxy, such as MOVPE, HVPE or MBE (Molecular Beam Epitaxy) and furthermore enable a measurement of the temperature at the wafer surface.

Accordingly, after the epitaxial crystal growth within the range of the second growth temperature, a template is obtained which, based on the above-described characteristics, is suited to produce crystals of outstanding quality and with outstanding features in further epitaxial growth steps. The template is thus excellently suited for the further use, it may also as such be provided, stored or shipped for further use, or it may be directly further used in an entire process.

Thus, in a further embodiment of the present invention, III-N single crystals can be produced which are obtained by carrying out subsequent to the crystal growth step at the second growth temperature—without or with interruption in between—an additional epitaxial crystal growth on the template obtained according to the invention for forming of III-N crystal at a crystal growth temperature which can be selected independently from the said first and second crystal growth temperatures (corresponding to step e) according to the invention of this embodiment). Thereby, the crystal growth temperature in step e) can be freely selected depending on III-N material desired for the epitaxial layer to be formed, and thus can be within the range at which there are good growth conditions of the respective III-N material.

Now, in step e) according to the invention, other conditions of the crystal growth can also be freely selected. For example, III-N materials can be grown which III-component can be freely selected. Furthermore, now indium may also be contained as III-component. Moreover, materials may be used which Al content is more than 60%.

Accordingly, in step e) according to the invention of this embodiment, at least one (optionally more) GaN-, AlN-, AlGaN-, InN-, InGaN-, AlInN- or AlInGaN-layer(s) can be deposited for producing accordingly thicker III-N layers or III-N single crystals. Preferably, the III-N crystal layer onto the substrate as well as the III-N crystal epitaxially grown thereon form a purely binary system, e.g. GaN, AlN or InN, or the III-N crystal layer onto the substrate is a purely binary system, in particular GaN, and the III-N crystal epitaxially grown thereon is a binary or ternary III-N material which can be freely chosen, in particular again binary GaN.

Step e) may directly follow step d), alternatively, the process may be interrupted therebetween. Furthermore, it is possible to carry out steps d) and e) within the same reactor, alternatively to change the reactor between said steps. This renders possible to grow the III-N single crystal by a growing method different from that used in the production of the provided template, in order to select optimum conditions for the respective steps. For instance, the additional epitaxial crystal grOwth on the template produced according to the invention is preferably carried out via HVPE. The advantageous selection of the step e) under HVPE conditions renders possible high growth rates and accordingly the obtaining of thicker layers. However, also all steps of the process relating to the entire growth of the III-N layer can be carried out in a single equipment using a particular growth technique, for example only via HVPE.

A further aspect of the present invention is a process for producing III-N single crystals, wherein III denotes at least one element of the third main group of the periodic table of the elements, selected from Al, Ga and In, wherein the process comprises the following steps:
aa) providing a template comprising a starting substrate and at least one III-N crystal layer, wherein the starting substrate and the at least one III-N crystal layer are formed such that the template within the temperature range of an epitaxial crystal growth is not or almost not curved or is negatively curved, and
bb) carrying out an epitaxial crystal growth of III-N crystal at a crystal growth temperature at which the template is not or essentially not curved or is negatively curved.

For the reasons already described in the preceding embodiments, it is also preferred here to add no In in steps aa) and bb). If desired, additional epitaxial crystal growth can optionally follow for forming of III-N crystal at a crystal growth temperature which can be independently selected from the said crystal growth temperatures of the step bb), wherein in this step of continued growth, Indium may optionally be added.

Subsequently, optionally a separating of the III-N single crystal layer(s) from the substrate is possible.

This aspect of the invention starts from the alternative solution principle of minimizing or eliminating altogether the risk of crack formation by the preconditions specified in the steps aa) and bb).

For providing a template for step aa) it may for example be referred to the above description concerning the formation of the template according to the invention.

For example as possibilities for the provision of a template for step aa), applicable as alternatives or optionally in combination, the above-described method of the temperature change during the growth or respectively the method of using a mask material interlayer in the forming of the template-III-N layer, likewise described above, can be applied. While for the former method it can be referred to the detailed description above, for the latter method exemplary embodiments are schematically shown in FIG. 6.

In the FIGS. 6A and 6B in the same step (1) initially the provision of the respective substrates 100A and 100B is shown. The respective substrates can optionally be pre-treated as described above, in particular said substrates can respectively be subjected to a desorption step and a nucleation step. In a nucleation step crystalline III-N material 101A or respectively 101B is formed, in particular minute III-N crystallites on the starting substrate (cf. step (2) of FIGS. 6A and 6B), which serves as seed crystals in the later further III-N crystal growth. The further steps can vary as concerns time point and position/location of the layer of the mask material and the resulting consequences thereof, as is illustrated respectively separately in FIGS. 6A and 6B. In the embodiment shown in FIG. 6A an interlayer made of mask material 102A is directly deposited already on the nucleation layer 101A, still before coalescence of the crystallites starts. In a further modification (not specifically shown here) this deposition of the interlayer is carried out not directly on the nucleation layer but only after a very short phase of a III-N growth, but still very close in the nanometer range to the nucleation layer, for example, at a distance in a range of up to 30 nm. In this distance range selected very close to the nucleation layer the subsequent steps occur practically analogous to the form shown in FIG. 6A. In the embodiment shown in FIG. 6B, on the nucleation layer 100B initially a III-N growth is carried out for a particular, generally still relatively short time, for example until a small thickness of the crystalline III-N layer 103B of 30 nm or beyond and suitably up to 300 nm or below has formed, preferably up to approximately 100 nm, more preferably up to approximately 50 nm, and only then an interlayer made of mask material 102B is deposited in the corresponding distance from the nucleation layer of the substrate. Suitably and advantageously the deposition of the denoted interlayer 102A or respectively 102B is carried out in the same reactor with a process which is compatible with the technique for growing the III-N layer of the template. For example, a silane gas and ammonia is flown into the reactor and reacted together at a suitable pressure and a suitable temperature for example 800° C. to 1200° C., preferably at about 1050 to 1150° C. and is deposited in the form of $Si_3N_4$ and optionally further stoichiometric or over- or substoichiometric $Si_xN_y$ compositions on the prepared substrate (100A; 101A). The step of depositing mask materials other than SiN, such as for example TiN, $Al_2O_3$, $SiO_2$, WSi, and WSiN, can readily and accordingly be adjusted. The thus formed mask layer 102A or respectively 102B can exhibit different forms. It is generally very thin, suitably in the nanometer or sub-nanometer range, for example below 5 nm, more preferably below 1 nm, in particular down to below one monolayer (i.e. 0.2 to 0.3 nm or less), and it can be homogeneously distributed on the surface and may form a continuous layer, alternatively however it exhibits rather microscopic/nano-structured gaps or a discontinuous structure (shown in the drawing schematically in the form of a dashed layer 102A or respectively 102B). After depositing the interlayer with mask material, the (continued) growth of a III-N layer 104A, 104B (stage (4) in FIG. 6A/6B) is carried out immediately thereafter until the template at the end of the growth (stage (5) in FIG. 6A/6B) exhibits a III-N layer 105A, 105B with desired thickness in the range from 0.1 to 10 µm, preferably in the range from 3 to 10 µm. According to the invention it is made sure also under this embodiment that the characteristics curvature (measured at the growth surface) and/or stress of the III-N layer of the template are favourably influenced and advantageously used for subsequent processes.

According to the invention it is effected that the curvature of the template decreases during the subsequent further growth of a growing III-N layer 104A or respectively 104B, as shown schematically in the respective steps (4) of FIGS. 6A/6B. Different from a situation without deposition, according to the invention by means of the the mask layer 102A/102B at suitable location/position even a decrease of the curvature is achieved and thus a curvature difference $K_s - K_e \geq 0$ is observed.

By the imprinting of lattice deformation and of compressive stress according to the invention, as a result the condition of the template provided in the step aa) can alternatively be defined in that it exhibits a value of $\epsilon_{xx} \leq 0$ (i.e. including $\epsilon_{xx} = 0$) at growth temperature, but in particular a value of $\epsilon_{xx} < 0$, wherein the value lies preferably within the range of $0 > \epsilon_{xx} > -0.0005$. Accordingly, at room temperature, a compressive stress of $\sigma_{xx} < -0.70$ GPa is present, and thus, the strain $\epsilon_{xx}$ at room temperature of the template exhibits a value of $\epsilon_{xx} < 0$, preferably in the range $0 > \epsilon_{xx} \geq -0.003$, more preferably in the range of $< -0.002$, in particular in the range of $-0.002$ to $-0.004$ and better still in the range of $-0.0020 \geq \epsilon_{xx} \geq -0.0025$.

The epitaxial crystal growth of the III-N crystal according to step bb) of this embodiment may be carried out according to step d) of the above described embodiment; in this connection, it is explicitly referred to the description corresponding thereto. In a preferred embodiment, this growth is carried out via HYPE. In particular, again, the III-N material can be freely selected. However, it is preferred that the III-N crystal layer onto the substrate as well as the III-N crystal layer epitaxially grown thereon, which now forms the III-N crystal, are composed of the same material, or that the change of the III-component is less that 10%. Furthermore, it is possible that no material exchange is carried out for the III-component in the III-N crystal layer onto the substrate as well as the III-N crystal epitaxially grown thereon. If no foreign substrate is used as starting substrate but a homo-substrate, then a further possible embodiment arises wherein the starting substrate, the III-N crystal layer onto the substrate as well as the III-N crystal epitaxially grown thereon are composed of the same III-N material.

According to the invention in the process for producing III-N single crystals according to the embodiments described above an epitaxial crystal growth on the provided template can be carried out such that after finishing the epitaxial growth (step e) or respectively bb) of the described embodiments), III-N single crystals having layer-thicknesses of at least 1 mm, preferably of at least 5 mm, more preferably of at least 7 mm and most preferably of at least 1 cm are obtained.

After completion of the epitaxial crystal growth for producing a III-N single crystal, the III-N single crystal can optionally be separated from the substrate (optional step f) or respectively cc)). In a preferred embodiment, this takes place via self-separation, such as during the cooling from a crystal growth temperature. In a further embodiment, the separation of III-N single crystal and the substrate can be performed by grinding-off, sawing-off or a lift-off process.

When the epitaxially grown III-N single crystal exhibits a sufficiently large thickness, wherein a so-called III-N boule or ingot is obtained, it is possible to separate this single crystal for forming a multitude of individual thin disks (wafers) by using suitable methods. The separation of the single crystals comprises common methods for cutting or sawing of III-N single crystals. The wafers thus obtained are excellently suited as a basis for producing semiconductor devices and components, for example opto-electronic and electronic components. The wafers produced according to the present invention are well suited for use as power components, high-frequency components, light-emitting diodes and in lasers.

A further aspect of the present invention is the provision of templates or respectively III-N single crystals adhering to foreign substrate. These products are available via the processes described above and are in particular suitable as basis material for producing thicker III-N layers or respectively boules (bulk crystals) and as basis for component production. These products provided according to the invention have the above described parameters with regard to the III-N single crystal, among others the given values $\epsilon_{xx} \leq 0$ (i.e. including $\epsilon_{xx} = 0$), in particular a $\epsilon_{xx}$-value of $<0$, preferably within the range of $0 > \epsilon_{xx} > -0.0005$ in the temperature range of an epitaxial crystal growth or respectively at room temperature.

In all of the process stages, in particular for the actual, epitaxially grown III-N layers and correspondingly in the III-N single crystal according to the present invention, the inclusion of dopants is possible. Suitable dopants comprise n- as well as p-dopants and may comprise elements selected from the group consisting of Be, Mg, Si, Ge, Sn, Pb, Se and Te.

For semi-isolating material suitable dopants can comprise elements selected from the group consisting of C, Fe, Mn and Cr.

In a further preferred embodiment, the obtained III-N single crystal is composed of gallium nitride, and this crystal exhibits in growth direction a lattice constant a within the range of $<a_0$, in particular within the range of 0.31829 nm$<a \leq 0.318926$ nm. As reference value of the lattice constant $a_0$ of GaN, here the value of $a_0 = 0.318926$ nm can be assumed (cf. V. Darakchieva, B. Monemar, A. Usui, M.

Saenger, M. Schubert, Journal of Crystal Growth 310 (2008) 959-965. This corresponds approximately to a lattice constant c within the range of $0 \leq \epsilon_{zz} < +0.001$.

EXAMPLES

Example 1

Figure 3:
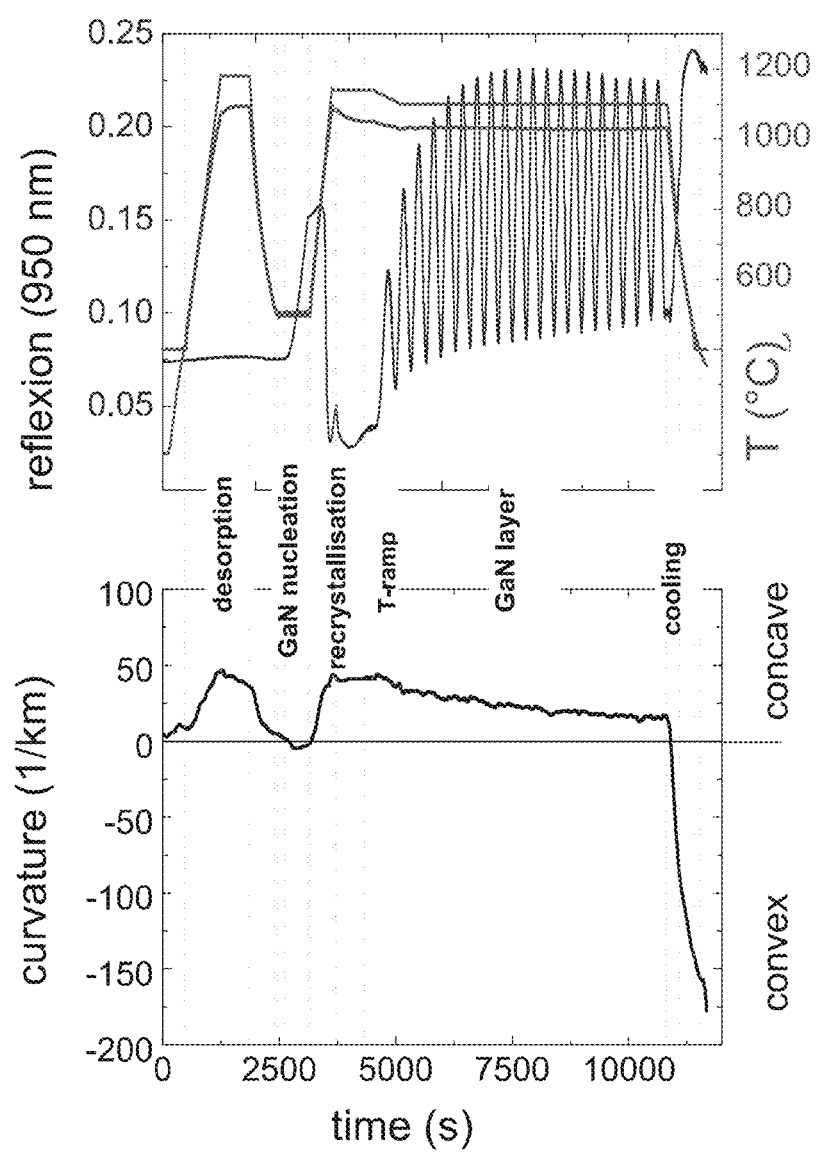
FIG. 3 illustrates temporal temperature-, reflection- and curvature-profiles during exemplary growth of GaN on sapphire according to one embodiment of the present invention.

Example 1 relates to GaN growth carried out on a sapphire starting substrate. The individual steps of the process are illustrated in FIGS. 2 and 3. FIG. 2 shows the change of the curvature of the groWth surface (right ordinate; lower line) depending on process steps 1 to 6 (corresponding to steps (i) to (vi) of the FIG. 1) and respectively applied temperature (left ordinate; upper and middle line).

In FIG. 3 the following parameters are plotted versus time: the change of the reflexion at 950 nm (top left diagram) as well as the temperature (top right diagram, wherein the upper curve expresses the set or respectively controlled process temperature and the lower curve expresses the real temperature at the wafer location), and the change of the curvature of the growth surface (lower diagram). The individual process steps are indicated between the two partial diagrams of FIG. 3, wherein in the following, the process step from FIG. 3 denoted with the term "GaN-layer" is termed "crystal growth."

The process steps indicated in FIG. 3 have the following correspondences of the FIG. 1:
"Desorption" corresponds to step (ii) of FIG. 1;
"GaN-nucleation" corresponds to step (iii) of FIG. 1;
"recrystallisation" corresponds to step (iv) of FIG. 1;
"T-ramp" corresponds to step (v) of FIG. 1;
"GaN-layer" corresponds to step (vi) of FIG. 1.

The measurement of the curvature of the growth surface is carried out in situ. The measurements were carried out with an EpicurveTT curvature measurement device by the company LayTec (Berlin, Germany) which allows to simultaneously obtain data on temperature, reflection and curvature of the growth surface.

In the following, details of a first embodiment for producing a template according to the invention are described. As growth technique a MOVPE is used. The temperatures given here relate to the temperature of the heaters; the temperature at the template or respectively the crystal is lower for about 200 K (cf. FIG. 2: here the nominal heater temperature is denoted by the upper line and the measured temperature of the wafer support is illustrated by the middle line).

Foreign Substrate:
c-plane sapphire substrate
430 μm thickness
unstructured
Desorption Step in MOVPE Multi Wafer Reactor
Reactor: Aix2600 G3 or G4
Reactor pressure: 200 hPa
Heating: from 400° C. to 1180° C. in 13 min
Reactor temperature: 1180° C.
Process temperature duration: 10 min in $H_2$ atmosphere
Cooling to 540° C.
Nucleation Step
Gas flows: 25 sccm TMGa, 1 slm $NH_3$
Cooling to 530° C.
Reduction of the satellite rotation by reducing the flow to 100 sccm respectively
Opening of the valves
Nucleation: 8 min 30 s
Increase of the ammonia flow to 5.5 slm
Recrystallisation
Heating from 530° C. to 1240° C. in 8 min
Simultaneous ramping of the reactor pressure to 600 hPa
Ceiling temperature: 370° C. and
Gas flow: 100 sccm TMGa, 16 slm $NH_3$. Thereafter, setting of the conditions for coalescence:
Reactor pressure: reducing from 600 hPa to 500 hPa in 10 min
Gas flow for increasing the deposition rate: 200 sccm TMG
Ceiling temperature: 310° C.
T-Ramp and Crystal Growth
Cooling from 1240° C. to 1210° C. in 10 min
Reactor pressure: 500 hPa, Hz-atmosphere
Gas flows: 200 sccm TMGa, 5500 sccm $NH_3$
Crystal growth time: 90 min
End of Growth and Cooling
Switching of heating and TMGa flow
Reducing $NH_3$: 5500 sccm to 4 slm in 5 min
Switching-off: $NH_3$-flow under 700° C.
Switching-over: $NH_3$-flow to Nz-flow As can be gathered from FIGS. 2 and 3, by applying the temperature ramp, i.e. reducing from the "first" to the "second" growth temperature, the (here: concave) curvature of the substrate (having GaN material initially formed thereon) is reduced to a curvature value $K_s$, and this (here: concave) curvature $K_s$ is further reduced at the "second" growth temperature in the course of the GaN crystal growth up to a curvature value $K_e$ at the end of the GaN crystal growth. The following relationship applies: curvature of the sapphire $K_s$ (pos. 5 in FIG. 2; also shown by arrow and point)>curvature of the GaN/sapphire $K_e$ (pos. 6 in FIG. 2; also shown by arrow and point), i.e. the GaN layer is intrinsically, compressively stressed. Here, the difference $K_s - K_e$ is a $\geq 5$ km$^{-1}$, however, it may still be set higher, e.g. $\geq 10$, $\geq 15$ or $\geq 20$ km$^{-1}$, by means of setting respectively higher temperature differences.

Curvature $K_s$: 36 km$^{-1}$
Curvature $K_e$: 16 km$^{-1}$
Values of the obtained GaN crystal (after cooling):
3.5 μm thick GaN layer (after 90 min MOVPE)
Lattice constant a: 0.31828
$\epsilon_{xx}$ value: −0.00203
$\sigma_{xx}$ value: −0.73 GPa
Half-life width of the rocking curve: 200 arcsec at 002 reflex and 380 arcsec at 302 reflex at an entry slit of 0.2 mm×2 mm of a Philips X'Pert Pro.

At the end at growth temperature in the "second" growth temperature, the GaN/sapphire template thus has a curvature value $K_e$ at crystal growth temperature of only at most 30 km$^{-1}$. Thus, a state of the template is provided whereupon this has no or almost no curvature within the temperature range of an epitaxial crystal growth.

The further procedure may be selected as required. For example, an additional epitaxial crystal growth may follow for forming of thicker III-N crystal. A such continued growth can be carried out at a crystal growth temperature which can in principle be selected independent from the mentioned first and second crystal growth temperatures.

Alternatively, the template may be cooled to room temperature and be placed at a later point of time, optionally at another place or in another reactor, in order to be used again or respectively processed again as required at a later stage. As derivable from FIGS. 2 and 3, in the present Example, the curvature tilts in the course of cooling to room temperature from concave to convex. By a cooling, an additional extrinsic compressive stress is added to the above described, intrinsically, compressive stress of the GaN layer. Thereby, compared with the Comparative Example described below, the compressively stressed III-N layer obtained according to the invention is stronger compressively stressed than a III-N layer stressed only by extrinsic compression.

As has surprisingly turned out, this compressively stressed III-N layer obtained according to the invention has a positive effect on the curvature behavior at room temperature and in particular on the optional re-heated state.

Because in case the such obtained template is heated again to operating temperature, i.e. is heated to a suitable epitaxial growth temperature, the state of a low or missing curvature ($K_e$) is recovered, such that the advantageous state for further epitaxial III-N crystal growth is attained again.

Example 2

Figure 4:
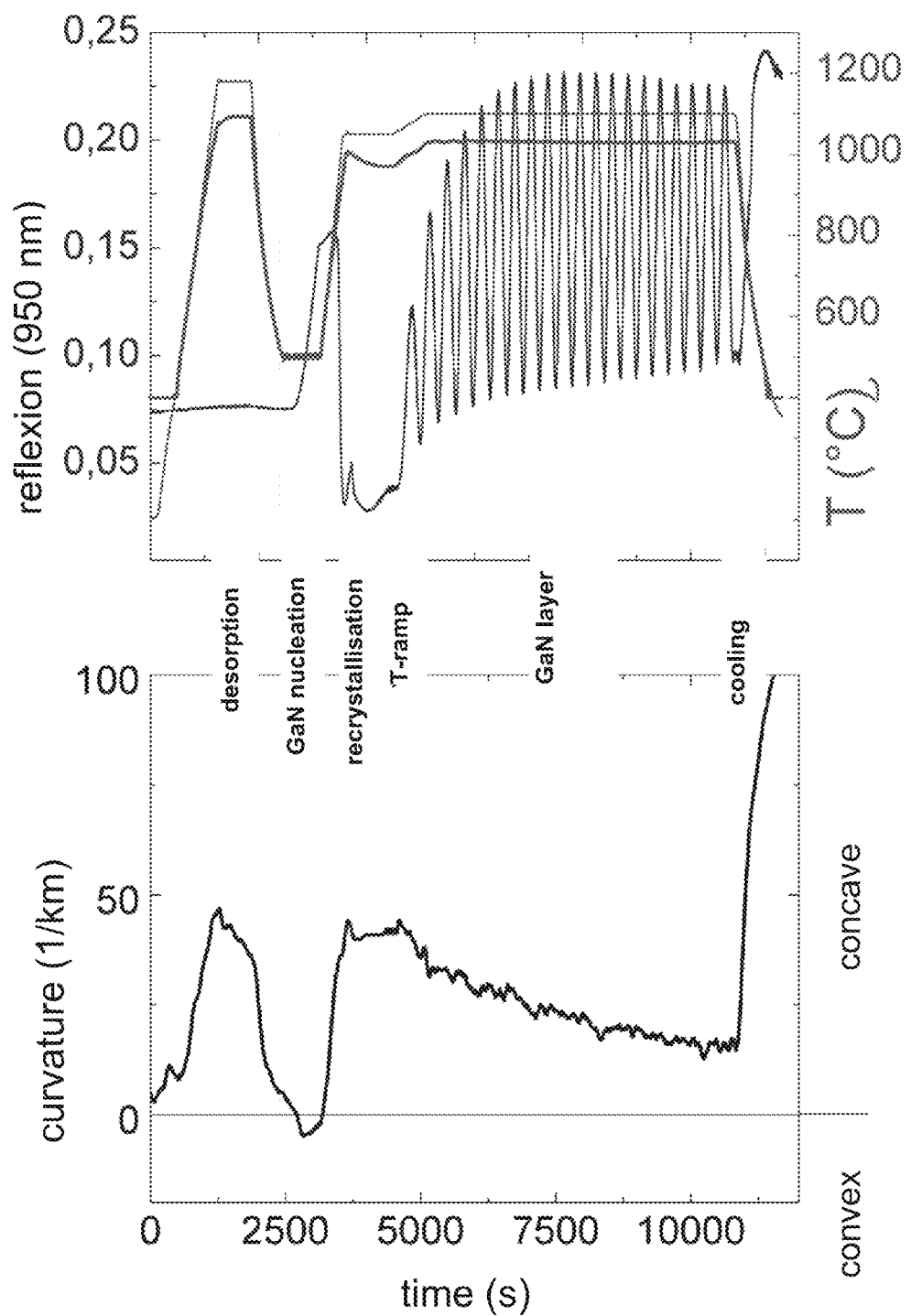
FIG. 4 illustrates temporal temperature-, reflection- and curvature-profiles during exemplary growth of GaN on Si or SiC according to an alternative embodiment of the present invention.

This example relates to GaN growth onto a foreign substrate which does not, like in Example 1, have a higher (sapphire) but only a thermal expansion coefficient lower than GaN, for example Si or SiC. Here, the performance can be effected according to Example 1, however with the difference that the indicated relevant change in temperature ("T-ramp") does not go down but goes up, as schematically illustrated by a corresponding FIG. 4. Though, the intended effect is qualitatively the same, namely a decrease of the curvature $K_s-K_e>0$ in the course of the further III-N growth of the template. Once the growth of the template is finished, either direct or indirect (without or with interruption) further growth onto this template may subsequently follow. Optionally, the template is cooled to room temperature, and in this case the template additionally curves/stresses thermically (extrinsically) at such a cooling to room temperature by nature, now further in the concave direction, as shown in FIG. 4. For the further use or respectively processing according to the invention it is however important that the additional thermic, extrinsic stress/curvature is reversible, and therefore, in case the template according to the invention is heated again to working temperature for epitaxial growth, a state of a low or missing curvature ($K_e$) is recovered (cf. FIG. 4, state of the curvature before "cooling"), such that the most advantageous state for further epitaxial III-N crystal growth is attained again.

Comparative Example

In a Comparative Example, the same procedural conditions may be applied, except that the temperature is not decreased.

Figure 5:
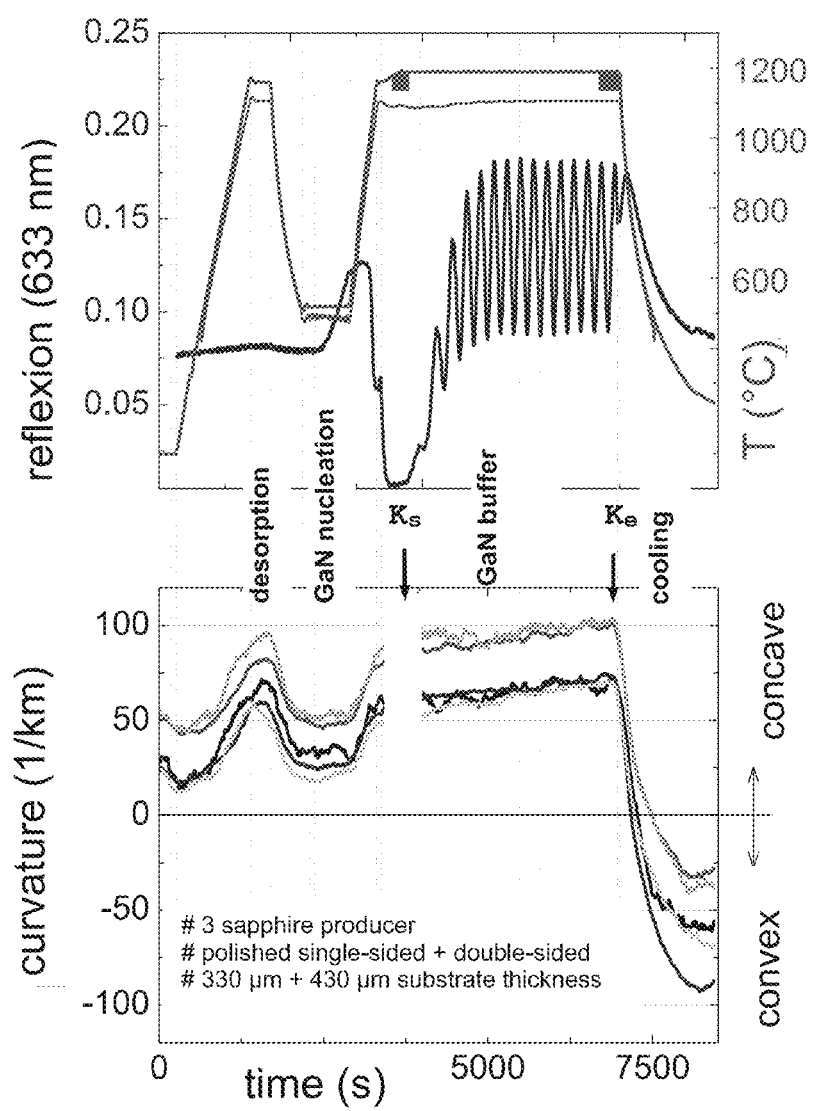
FIG. 5 illustrates temporal temperature-, reflection- and curvature-profiles during conventional growth of GaN on sapphire.

FIG. 5 shows typical in situ data of the MOVPE growth of GaN on sapphire in such a Comparative Example, i.e. without application of a well-targeted temperature ramp. Analogous to FIGS. 3 and 4, the following parameters are plotted versus time: the change of the reflexion at 950 nm (top left diagram ordinate) as well as the temperature (top right diagram ordinate, wherein the upper curve expresses the set or respectively controlled process temperature and the lower curve expresses the real temperature at the wafer location), and the change of the curvature of the growth surface (lower diagram). The lower picture shows the development of the curvature during the process for five different sapphire substrates. The arrows indicate the curvature values $K_s$ and $K_e$ to be referred to (cf. also the positions of the temperature curve indicated by quadratic points), and $K_s-K_e<0$ does apply, i.e. the GAN layer is intrinsically stressed in a tensile manner. By means of a cooling, this stress of the GaN layer is superimposed by an extrinsically compressive stress.

Typical values for the Comparative Example:
Curvature $K_s$: 50 km$^{-1}$,
Curvature $K_e$: 70 km$^{-1}$,
$\epsilon_{xx}$-value: −0.0015,
$\sigma_{xx}$-value: −0.55 GPa.

Example 3

Onto the template produced according to Example 1 and in parallel thereto onto the template produced according to the Comparative Example, in a HVPE plant under conventional process parameters, about 1 mm thick GaN boules are grown respectively. Thereby, compared with the Comparative Example, the marginal compressive stress set in the template according to Example 1 has a positive effect in that the tendency towards crack formation is lower.

Example 4

In the following Examples 4 and 5 further embodiments are described with which alternatively a template can be provided which in the temperature range of an epitaxial crystal growth is not or is essentially not curved or is negatively curved, which template is then suited very well for carrying out a further epitaxial crystal growth of III-N crystal. As growth technique for example a MOVPE on pre-treated sapphire (which is subjected to a desorption and a nucleation) is used with the details given in the following. The temperatures given here relate to the nominally set temperature of the heaters; the temperature at the template or respectively the crystal is lower, in some cases up to about approximately 70 K lower.

Reactor:
MOVPE reactor Aixtron 200/4 RF-S, single wafer, horizontal
Foreign Substrate:
c-plane sapphire substrate, off-cut 0.2° in m-direction
430 µm thickness
unstructured
Desorption Step (FIG. 6 (1); 100)
Reactor pressure: 100 mbar
Heating: from 400° C. to 1200° C. in 7 min
Reactor temperature: 1200° C.
Process temperature duration: 10 min in $H_2$ atmosphere
Cooling to 960° C.
Nucleation Step (FIG. 6 (2); 101)
Gas flows: 25 sccm trimethyl aluminium (TMAl), bubbler: 5° C., 250 sccm $NH_3$
Cooling to 960° C.
Opening of the valves
Nucleation: 10 min
Increase of the ammonia flow to 1.6 slm
T-Ramp; Optionally Crystal Growth (FIG. 6 (2) to Before (3); 103)
Heating from 960° C. to 1100° C. in 40 sec
Reactor pressure: 150 mbar, $H_2$ atmosphere
Gas flows: optionally 16-26 sccm trimethyl gallium (TMGa), 2475 sccm $NH_3$
Crystal growth time: 0-10 min (corresponding to 0-300 nm)
SiN Deposition (FIG. 6 (3); 102)
Gas flows: 0.113 µmol/min silane, 1475 sccm $NH_3$
No TMGa
Pressure: 150 mbar Temperature: 1100° C.
Duration: 3 min
Further Crystal Growth: (FIG. 6 (4); 104)
1100° C.
reactor pressure: 150 mbar, H$_2$ atmosphere
gas flows: 26 sccm TMGa, 2000 sccm NH$_3$
crystal growth time 90-240 min, corresponding to 3-10 µm GaN thickness
Growth End and Cooling: (FIG. 6 (5)-(6))
Switching-off of heating and TMGa flow
Lowering of NH$_3$: 2000 sccm to 500 sccm in 40 sec
Switching-off: NH$_3$ flow under 700° C.
Switching-over: NH$_3$ flow to N$_2$ flow FIG. 7A shows the course of the curvature at growth temperature (1350° K), plotted against the thickness of the grown GaN layer and thus in the temporal course, distinguished respectively according to distance of the SiN (Si$_x$N$_y$) with respect to the AlN nucleation layer. In this respect the zero point relates to the beginning of the continued growth of the III-N layer 104A, 104B (i.e. after stage (3) and before or respectively during stage (4) in FIGS. 6A/6B). The curvature behaviour can be purposively and precisely controlled. The following Table 1 gives the in situ, i.e. measured at growth temperature, $\epsilon_{xx}$ values and the curvature values C (km$^{-1}$) measured at room temperature and the $\epsilon_{xx}$ values at room temperature determined from C towards the end of the template production with respective thicknesses of about approximately 7 µm.

TABLE 1

| distance AlN and SiN | thickness (µm) | $\epsilon$ in-situ | C @ RT (km$^{-1}$) | $\epsilon$ @ RT |
|---|---|---|---|---|
| 0 nm | 7.21 | −6.00E−04 | −396 | −2.27E−03 |
| 15 nm | 7.09 | −4.50E−04 | −365 | −2.13E−03 |
| 30 nm | 6.76 | −4.00E−04 | −367 | −2.24E−03 |
| 60 nm | 6.73 | 1.10E−04 | −298 | −1.83E−03 |
| 90 nm | 6.81 | 1.00E−04 | −299 | −1.82E−03 |
| 300 nm | 7.29 | 2.50E−04 | −293 | −1.66E−03 |

Example 5 and Comparative Examples

Figure 7B:
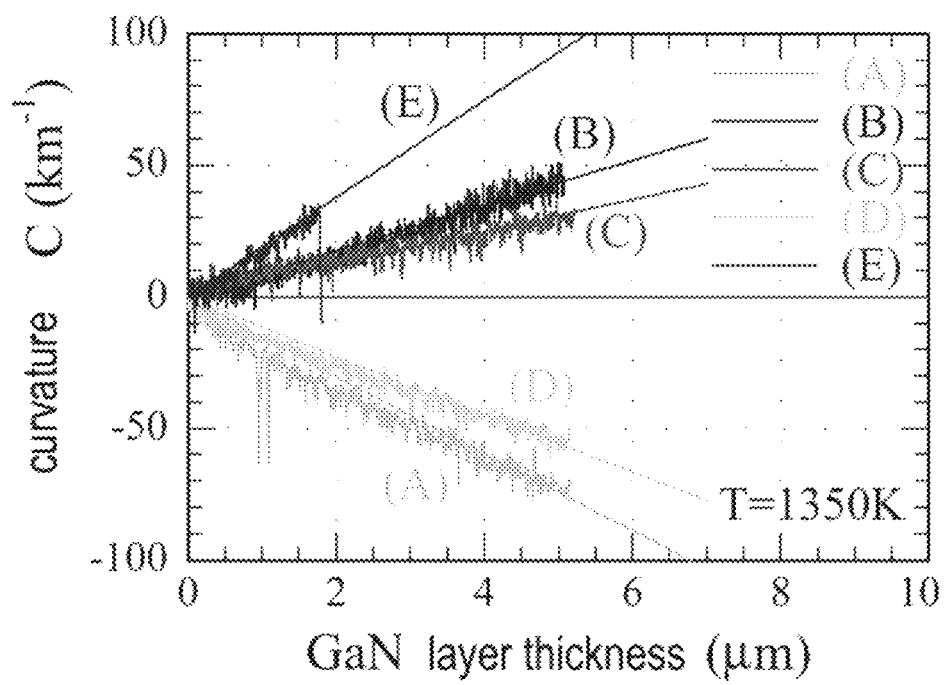
Figure 7C:
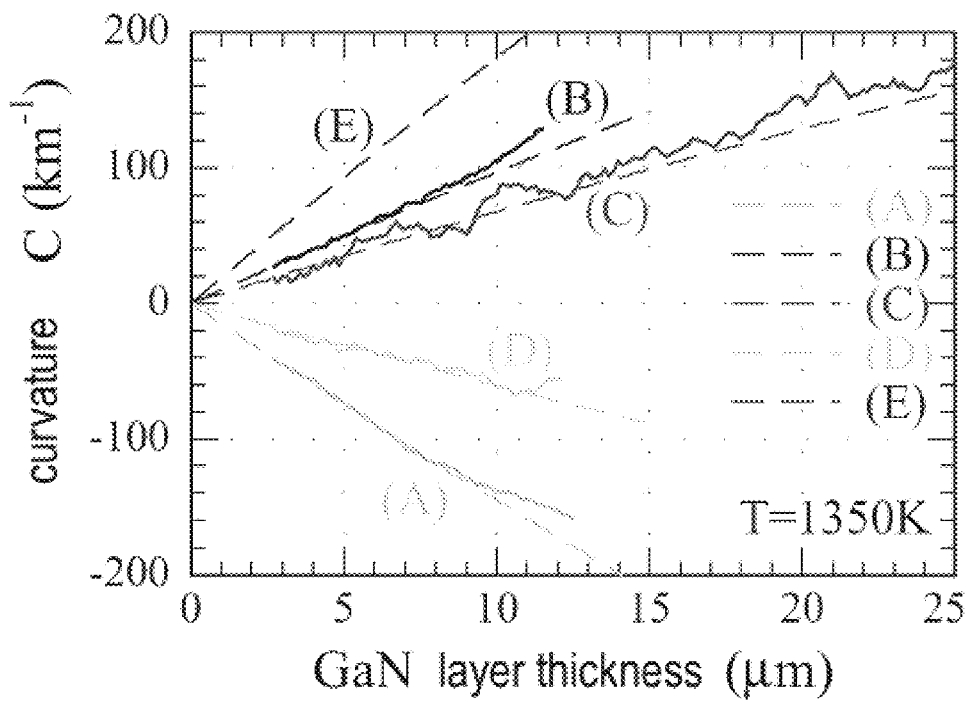
FIG. 7C shows the results with respect to curvature of the growth surface when the templates defined according to FIGS. 7A and 7B are subjected to a further III-N (GaN) layer growth for producing thicker layers, in comparison to comparative examples.

On selected templates produced according to Example 4 for which GaN layers with SiN interlayers directly on the nucleation layer (sample A) or after a very small (15-30 nm; sample D) or larger (300 nm; sample C) distances were deposited or according to Comparative Examples for which GaN was grown without SiN (sample B) or on low temperature GaN nucleation layer (sample E), the curvature was followed analogous to Example 4, namely in the range of a MOVPE growth to approximately 7 µm as shown in FIG. 7B, or during performing further HVPE growth to approximately 25 µm as shown in FIG. 7C. The results of the FIGS. 7B and 7C show once more the significantly better results regarding setting and behaviour of the curvature of the templates according to the invention (A), (C) and (D) compared to the comparative templates (B) and (E) without SiN interlayer.

The invention claimed is:

1. A process for producing a template for producing a III-N crystal, the template comprising a substrate and at least one III-N crystal layer, the process comprising:
   a) selecting at least one group III element from the group consisting of Al, Ga and In;
   b) growing a crystalline III-N material comprising the at least one selected group III element directly on a substrate, wherein growing the crystalline III-N material comprises formation of a III-N nucleation layer comprising the at least one selected group III element at a third growth temperature, recrystallization of the III-N nucleation layer to form the crystalline III-N material, and growth of the crystalline III-N material at a first crystal growth temperature, wherein the first growth temperature is higher than the third growth temperature, and wherein the substrate is a non-composite substrate;
   c) changing the temperature to a second crystal growth temperature; and
   d) continuing growth of the crystalline III-N material at the second crystal growth temperature,
   wherein:
   the second crystal growth temperature is lower than the first crystal growth temperature if the thermal expansion coefficient of the substrate is greater than that of the crystalline III-N material; and
   the second crystal growth temperature is higher than the first crystal growth temperature if the thermal expansion coefficient of the substrate is less than that of the crystalline III-N material.

2. The process according to claim 1, wherein said template is further processed for producing a III-N single crystal, the process further comprising:
   e) additionally growing epitaxially the crystalline III-N material at a crystal growth temperature regime having a temperature range that promotes growth of the crystalline III-N material, selected independently from said first and second temperatures.

3. The process according to claim 1 wherein the difference between the first and second crystal growth temperatures is at least at 10° C.

4. The process according to claim 1, wherein the change from the first to the second crystal growth temperatures takes place when crystallite coalescence starts and crystal growth proceeds on the coalesced III-N crystallites at the second crystal growth temperature, wherein a curvature of a growth surface of the III-N single crystal decreases.

5. The process according to claim 1, wherein the curvature ($K_s$) of the template at the end of the crystal growth at the second crystal growth temperature is less than the curvature ($K_e$) of the template at the beginning of the crystal growth at the second crystal growth temperature, so that the curvature difference ($K_s$-$K_e$) of the template has a positive algebraic sign.

6. The process according to claim 1, wherein the crystalline III-N material deposited onto the substrate during the crystal growth at the second crystal growth temperature has a thickness within the range of 0.1-10 pm.

7. The process according to claim 2, wherein Indium is added during the additional epitaxial growth of the crystalline III-N material at the crystal growth temperature regime.

8. The process according to claim 2, further comprising:
f) separating the crystalline III-N material from the substrate.

9. The process according to claim 1, wherein the temperature is changed from the first crystal growth temperature to the second crystal growth temperature without interrupting the growth process.

10. A process for producing a III-N single crystal, the process comprising: producing in accordance with claim 1 a template comprising a substrate and at least one III-N crystal layer comprising at least one element selected from the group consisting of Al, Ga and In; and epitaxially growing a III-N crystal on the template at a crystal growth temperature at which the template is not or essentially not curved or is negatively curved.

11. The process according to claim 10, wherein after completion of the epitaxial crystal growth, curvature is at most 30 km$^{-1}$ at the crystal growth temperature.

12. The process for producing a single crystal according to claim 10, wherein the template
   (i) has a compressive stress of o$_{xx}$<−0.70 GPa at room temperature; or
   (ii) has a value sxx within the temperature range of an epitaxial crystal growth of sxx<0, and/or a value sxx at room temperature of sxx<0.

13. The process according to claim 10, wherein the substrate has a higher thermal expansion coefficient than the III-N crystal to be grown and is selected from the group consisting of LiAlO$_2$ and sapphire.

14. The process according to claim 10, wherein the substrate has a lower thermal expansion coefficient than the III-N crystal to be grown and is selected from the group consisting of SiC and Si.

15. The process for preparing a III-N single crystal according to claim 8, characterized in that, the template has a curvature K$_T$(3.5 μm;430 μm) within the range of −170 km$^{-1}$>K$_T$>−250 km$^{-1}$ when the substrate comprises sapphire of a thickness (d$_{sapphire}$) of 430 μm, and the at least one III-N crystal layer comprises GaN of a thickness (d$_{GaN}$) of 3.5 μm, wherein the curvature value K$_T$ depends on respective layer thicknesses analogous to the Stoney equation in the following range:

$$K_{T(dGaN;dsapphire)} = K_T(3.5 \text{ μm};430 \text{ μm}) \times (430 \text{ μm}/d_{sapphire})^2 \times (d_{GaN}/3.5 \text{ μm}).$$

16. The process for preparing a III-N single crystal according to claim 10, wherein after completion of the epitaxial growth, the III-N single crystal has a thickness of at least 1 mm.

17. The process according to claim 10, wherein Indium is not added during the epitaxial growth of the III-N crystal.

18. The process according to claim 10 further comprising:
   additionally epitaxially growing, the III-N crystal at a crystal growth temperature regime having a temperature range that promotes growth of the III-N crystal, selected independently from said crystal growth temperature.

19. The process according to claim 18, wherein Indium is added during the additional epitaxial growth of the III-N crystal at the crystal growth temperature regime.

20. The process according to claim 18, further comprising separating the III-N crystal from the substrate.

* * * * *